(12) United States Patent
Kawashima et al.

(10) Patent No.: US 7,630,058 B2
(45) Date of Patent: Dec. 8, 2009

(54) EXPOSURE APPARATUS AND DEVICE MANUFACTURING METHOD

(75) Inventors: Haruna Kawashima, Haga-gun (JP); Nobuyuki Saito, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/179,923

(22) Filed: Jul. 25, 2008

(65) Prior Publication Data
US 2009/0033904 A1    Feb. 5, 2009

(30) Foreign Application Priority Data
Jul. 30, 2007    (JP) .............................. 2007-197852

(51) Int. Cl.
*G03B 27/54*    (2006.01)
*G03B 27/42*    (2006.01)

(52) U.S. Cl. .......................................... 355/67; 355/53

(58) Field of Classification Search .................. 355/52, 355/53, 55, 67–71; 250/548; 356/399–401
See application file for complete search history.

(56) References Cited

U.S. PATENT DOCUMENTS

| | | | |
|---|---|---|---|
| 4,870,452 A | 9/1989 | Tanimoto et al. | |
| 5,191,200 A | 3/1993 | van der Werf et al. | |
| 6,281,966 B1* | 8/2001 | Kenmoku | 355/55 |
| 6,496,257 B1 | 12/2002 | Taniguchi et al. | |
| 6,878,916 B2* | 4/2005 | Schuster | 250/201.2 |
| 7,466,395 B2* | 12/2008 | Ohsaki et al. | 355/67 |
| 7,508,488 B2* | 3/2009 | Freimann et al. | 355/53 |
| 2002/0005495 A1 | 1/2002 | Kohno | |
| 2005/0030506 A1 | 2/2005 | Schuster | |

FOREIGN PATENT DOCUMENTS

| | | |
|---|---|---|
| EP | 1 746 464 A2 | 1/2007 |
| JP | 2-244707 A | 9/1990 |
| JP | 11-283903 A | 10/1999 |
| JP | 2005-268412 A | 9/2005 |

OTHER PUBLICATIONS

Search Report issued on Nov. 6, 2008, concerning EP Application No. 08159489.7-1226.

* cited by examiner

*Primary Examiner*—Hung Henry Nguyen
(74) *Attorney, Agent, or Firm*—Rossi, Kimms & McDowell, LLP

(57) ABSTRACT

This invention provides an exposure apparatus which exposes a substrate (51) with a pattern formed on a reticle (3), and includes a projection optical system (1) including an optical element (11-14) and a reflecting surface (42) which reflects light toward the projection optical system (1). The exposure apparatus further includes a processor (P) which obtains information indicating a surface condition of the optical element (11-14) based on first light which is incident on the projection optical system (1) and reflected by the reflecting surface (42) and a surface of the optical element (11-14) and second light which is incident on the projection optical system (1) and not reflected by the reflecting surface (42) and the surface of the optical element (11-14).

10 Claims, 15 Drawing Sheets

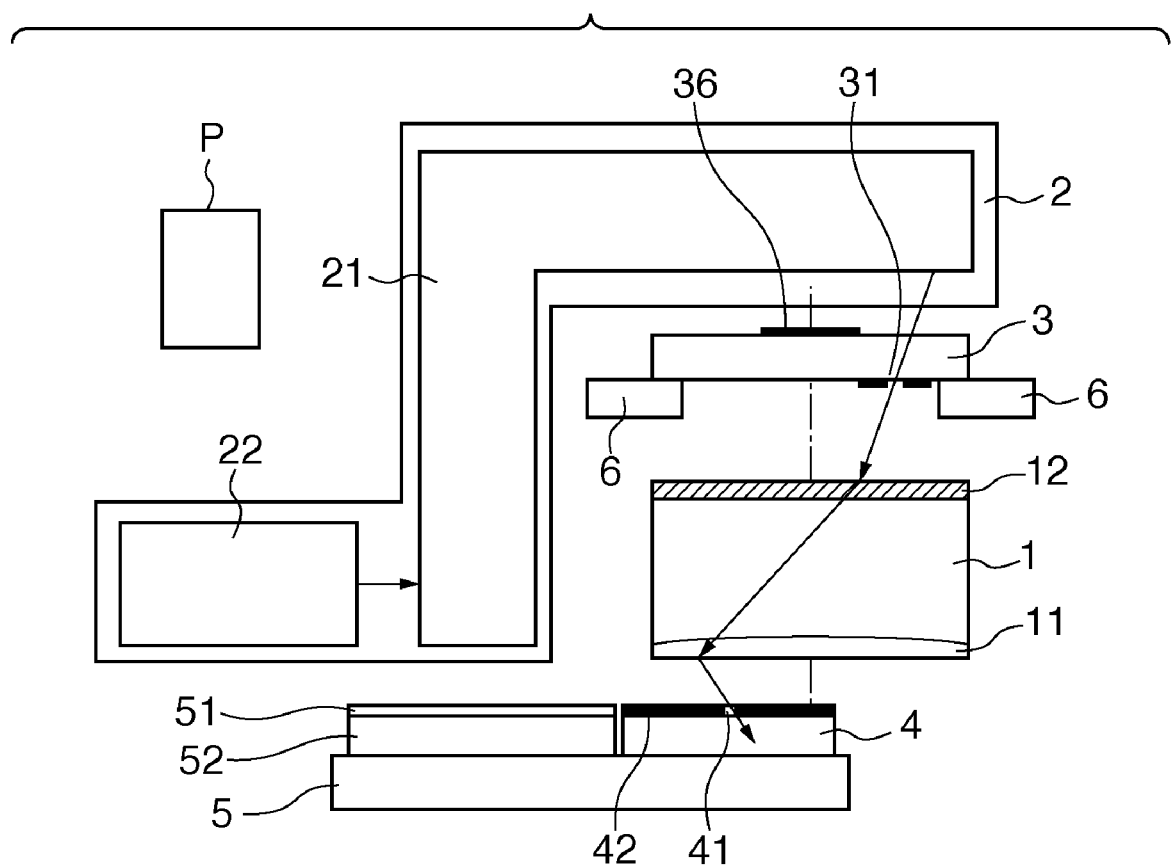
F I G. 2C

WHEN n = 9

F I G. 11C
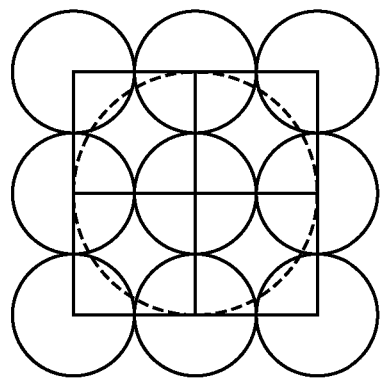
F I G. 11D
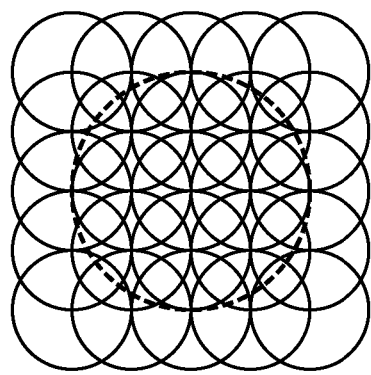
F I G. 12
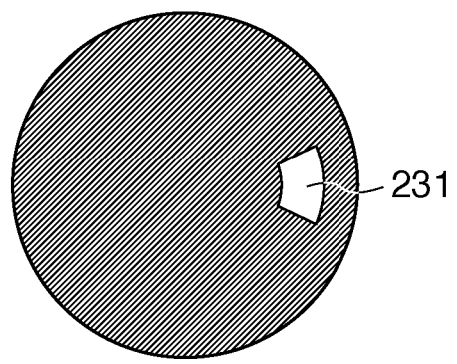

EXPOSURE APPARATUS AND DEVICE MANUFACTURING METHOD

BACKGROUND OF THE INVENTION

1. Field of the Invention

The present invention relates to an exposure apparatus and device manufacturing method.

2. Description of the Related Art

In the lithography process to manufacture a semiconductor element, liquid crystal display device, and the like, a fine-line-width circuit pattern formed on a reticle or the like is projected onto a photosensitive substrate such as a wafer coated with a resist layer, and exposed using a high-resolution projection exposure apparatus.

In the projection exposure process, a volatile substance or the like produced from a photosensitive resin used to form the resist layer applied to the wafer may attach to the surface of an optical member in a projection optical system to contaminate the surface of the optical member. Therefore, in the projection exposure apparatus, operation of wiping the surface of the optical member of the projection optical system, that is, the cleaning operation, by the operator is indispensable. Regarding the timing of performing the cleaning operation, the cleaning operation is performed when the operator visually confirms the contaminated state, or at a predetermined constant periodic timing.

In recent years, the semiconductor integrated circuits shrink more and more in feature size, and the line width uniformity of a transferred pattern is required of a semiconductor exposure apparatus. As a factor that degrades the line width uniformity, the influence of flare occurring in the projection exposure optical system has become no longer negligible. The flare occurring in the projection exposure optical system makes the illuminance distribution within the exposure screen nonuniform to cause a nonuniformity in the line width of an optical image within the screen. The projection exposure optical system refers to a combination of an illumination optical system and projection optical system. The flare of the projection exposure optical system occurs when the reflectance of the surface of the optical element increases due to contamination or the like on the optical element surface.

Conventionally, the flare of the projection exposure optical system is estimated from the exposure result to a wafer coated with a resist. For example, the flare amount occurring in the entire projection exposure optical system is predicted from a change in line width of a pattern image exposed by the semiconductor exposure apparatus, or a change in amount of a resist film outside the exposure region which remains after exposure is performed a plurality of number of shots by changing the exposure amount.

Japanese Patent Laid-Open No. 11-283903 proposes an automatic measurement means which measures contamination of the surface of an optical element in a projection optical system which constitutes a projection exposure optical system. The technique described in Japanese Patent Laid-Open No. 11-283903 discloses an automatic measurement means for measuring the reflectance of the surface of an optical element which is the closest to a photosensitive substrate, and an automatic photo-cleaning means for removing contamination on the surface of the optical element which is the closest to the photosensitive substrate.

According to the technique described in Japanese Patent Laid-Open No. 11-283903, a measuring light beam is obliquely incident on the surface of the optical element on the photosensitive substrate side from outside the projection optical system without passing through the projection optical system, and the reflected light amount of the obliquely incident measuring light beam is measured. Therefore, it is difficult to measure the reflectance on the inner surface of an inner optical element which constitutes the projection optical system. In this manner, with the prior art, it is difficult to measure an increase in flare of each of the optical elements that constitute the projection optical system.

According to the technique described in Japanese Patent Laid-Open No. 11-283903, a light source is additionally provided between the projection optical system and photosensitive substrate to implement the automatic measurement means. This complicates the arrangement of the exposure apparatus.

SUMMARY OF THE INVENTION

The present invention has been made in view of the above situation, and has as its object to provide an exposure apparatus with a simple arrangement which can obtain information indicating the surface condition of an optical element constituting the projection optical system of an exposure apparatus.

In order to achieve the above object, according to the present invention, there is provided an exposure apparatus which exposes a substrate with a pattern formed on a reticle, the apparatus comprising:

a projection optical system including an optical element;

a reflecting surface which reflects light toward the projection optical system; and a processor which obtains information indicating a surface condition of the optical element based on first light which is incident on the projection optical system and reflected by the reflecting surface and a surface of the optical element and second light which is incident on the projection optical system and not reflected by the reflecting surface and the surface of the optical element.

The present invention can provide an exposure apparatus with a simple arrangement which can obtain information indicating the surface condition of the optical element constituting the projection optical system of the exposure apparatus.

Further features of the present invention will become apparent from the following description of exemplary embodiments with reference to the attached drawings.

BRIEF DESCRIPTION OF THE DRAWINGS

FIG. 2C is a view for explaining the exposure apparatus according to the second embodiment;

FIG. 11C is a view for explaining the relationship between measurement points and light receiving apertures in the seventh embodiment;

FIG. 11D is a view for explaining the relationship between measurement points and light receiving apertures in the seventh embodiment; and FIG. 12 is a view for explaining a stop positioned on the pupil plane of an illumination optical system.

DESCRIPTION OF THE EMBODIMENTS

First Embodiment

Figure 1A:
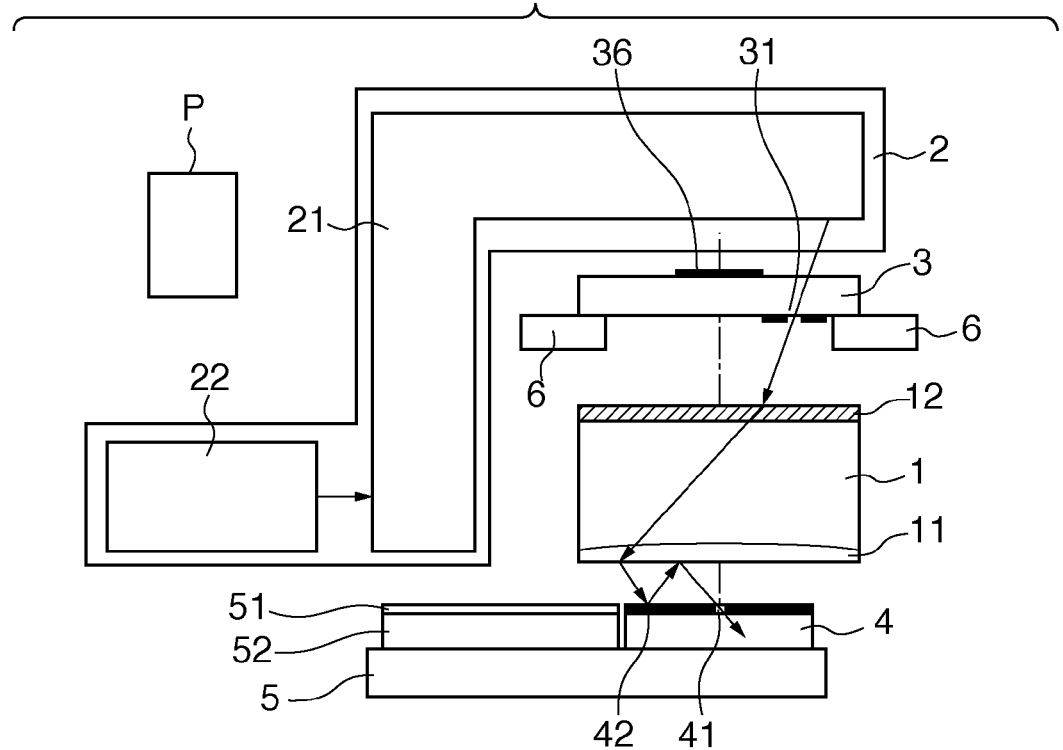
FIG. 1A is a view for explaining an exposure apparatus according to the first embodiment.

An example of an exposure apparatus according to the present invention will be described with reference to FIGS. 1A and 1B. An illumination system 2 comprises a light source 22 such as a laser, and an illumination optical system 21.

Light from the light source 22 illuminates a reticle 3 placed on a reticle stage 6 through the illumination optical system 21 with a desired illumination mode (effective light source shape), a desired polarization state, and a desired illuminance distribution. A masking blade (not shown) with a changeable aperture is formed at a position in the illumination optical system 21 which is optically conjugate with the reticle surface. The masking blade can limit the illumination range on the reticle 3 within a desired region. An exposure amount sensor (not shown) to control the exposure amount of the illumination system 2 is formed in the illumination optical system 21.

A pattern is formed on the lower surface of the reticle 3. Diffracted light from the pattern forms an image on a resist-coated substrate 51 such as a wafer placed on a substrate stage 5 through a projection optical system 1, thus transferring the pattern. The substrate such as a wafer, glass plate, or the like will be referred to as "a wafer" hereinafter.

The projection optical system 1 generally employed in the exposure apparatus is an optical system that is telecentric on at least one of the object plane side and image plane side. This is because if particularly the object plane side is telecentric, when adjusting the focus by changing the wafer height, a change in image formation magnification can be theoretically eliminated.

An inner optical element that constitutes the projection optical system 1 is purged with a gas such as clean dry air or inert gas that does not contain a contaminant, so the surface of the optical element is not easily contaminated. The outermost surfaces of the optical system which form the object plane side and image plane side of the projection optical system 1 are respectively in contact with space where driving mechanisms such as a reticle stage and a substrate stage which supports the wafer are present.

The space where the reticle stage and substrate stage are present cannot be completely free from the contaminant in the atmosphere due to the presence of the driving mechanisms. That surface of the optical element of the projection optical system 1 which is in contact with this space is accordingly easily affected by the contamination. Hence, the outermost surfaces of the optical system which form the object plane side and image plane side of the projection optical system 1 can be changed where necessary.

In a scanning type semiconductor exposure apparatus, pattern transfer takes place while scanning the reticle stage 6 and substrate stage 5 in synchronism with each other. A reticle transport system and wafer transport system (neither is shown) load and unload the reticle 3 and wafer 51 in and from the exposure apparatus, respectively. The reticle 3 and wafer 51 loaded by the corresponding transport systems are chucked and fixed on the reticle stage 6 and a wafer chuck 52, respectively.

Figure 1B:
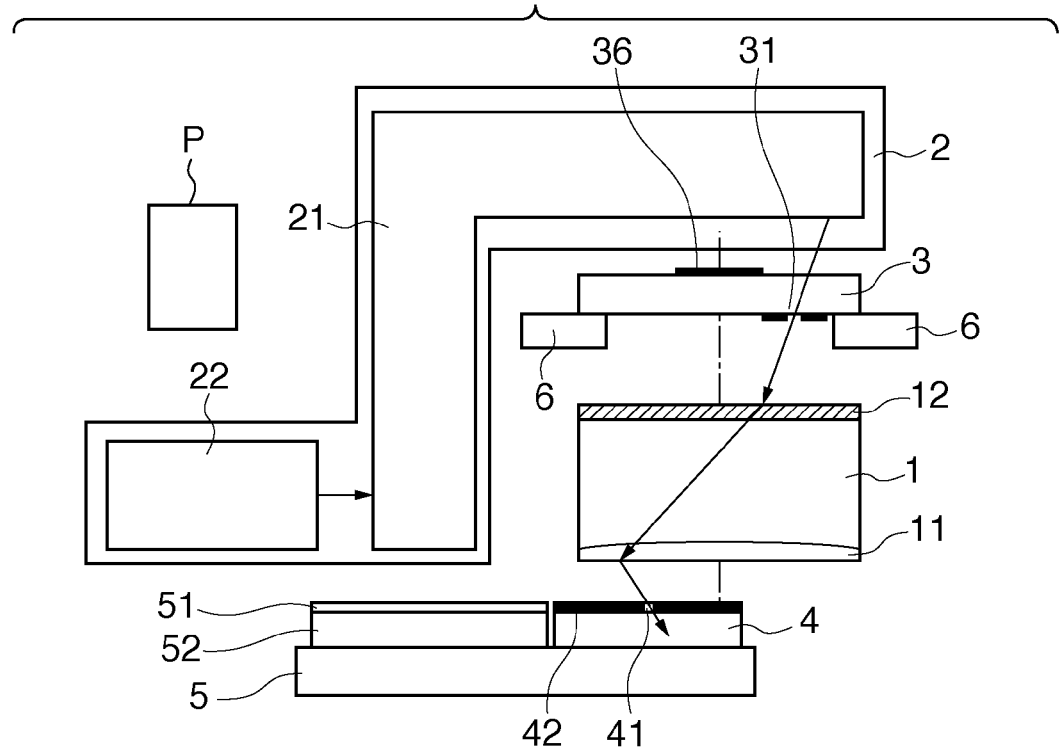
FIG. 1B is a view for explaining the exposure apparatus according to the first embodiment.

The reticle stage 6 can be driven in the scanning direction (the direction perpendicular to the surface of the sheet of drawing of each of FIGS. 1A and 1B), and the substrate stage 5 can be driven in the scanning direction and a direction perpendicular to the scanning direction. An autofocus mechanism (not shown) can drive the substrate stage 5 for leveling in the horizontal plane and control it in the direction of optical axis (the vertical direction in FIGS. 1A and 1B) of the projection optical system 1. A wafer side light amount sensor 4 is formed on the substrate stage 5.

A processor P controls the illumination system 2, reticle stage 6, and substrate stage 5.

Measurement of the surface reflectance as information representing the surface condition of a wafer side optical element 11 of the projection optical system 1 will be described hereinafter. In the states shown in FIGS. 1A and 1B, the reflectance of the wafer side optical element 11 of the projection optical system 1 is calculated from the light amount measurement value of an exposure amount sensor (not shown) formed in the illumination system 2 and the light amount measurement value of the wafer side light amount sensor 4 formed on the substrate stage 5.

Measurement of the reflectance of the optical element surface in the state in FIG. 1A will be described. A shaping member provided to the illumination optical system 21 shapes the light emitted by the light source 22 in the illumination system 2, so that the light is incident on the object plane of the projection optical system 1 not perpendicularly but obliquely. As the shaping member, a stop 23 having an aperture 231 as shown in FIG. 12 may be used. When the stop 23 is located at a position in the illumination system 2 where it serves as an optical pupil plane with respect to the reticle surface, a monopole effective light source having one pole on the pupil plane of the projection optical system 1 is formed. The diameter of the pole is preferably 0.2 or less when converted using σ.

The reflectance of the optical element as the measurement target is as low as 0.1 (inclusive) to 0.2 (inclusive). Therefore, as the shaping member, it is preferable to use not a stop but a computer generated hologram. For example, when forming a monopole effective light source having a diameter of 0.1 when converted using σ, if a computer generated hologram is used, when compared to a monopole effective light source formed by cutting an ordinary circular effective light source with σ of 0.8, an effective light source having an illuminance several ten times higher can be formed. This is very desirable.

Light emitted from the illumination optical system 21 and shaped by the shaping member illuminates a transmissive aperture pattern 31 of the reticle 3 positioned on the object plane of the projection optical system 1. The light beam passing through the transmissive aperture pattern 31 is focused on a reflecting surface 42 of the wafer side light amount sensor 4 placed on the substrate stage 5 by projection optical system 1, and is reflected. The light beam reflected by the reflecting surface 42 is then reflected by the surface of the wafer side optical element 11 which is the outermost in the projection optical system 1, received by the wafer side light amount sensor 4 through a light receiving aperture 41, and photoelectrically converted. The wafer side light amount sensor 4 is a sensor that detects light being incident on the projection optical system 1 and emitted from the projection optical system 1. In the state in FIG. 1A, the light detected by the wafer side light amount sensor 4 is the first light being incident on the projection optical system 1 and reflected by the reflecting surface 42 and the surface of the wafer side optical element 11.

At this time, the position of the substrate stage 5 with which the obliquely incident light beam is incident on the light receiving aperture 41 is calculated in advance, and the substrate stage 5 is driven. The position with which the obliquely incident light beam enters the light receiving aperture 41 can be obtained by calculating a so-called light beam trace from the following five pieces of information:

the optical data of the projection optical system 1
the position with which the light beam enters the projection optical system 1
the angle of incidence at which the light beam enters the projection optical system 1
specification of that surface of an optical element in the projection optical system 1 the reflectance of which is to be measured
the position of the reflecting surface located at a position optically conjugate with the image plane of the projection optical system 1

A person skilled in the art can easily perform this calculation by automatic calculation of a computer in the projection exposure apparatus.

The wafer side optical element 11 in the projection optical system 1 which is the closest to the wafer is often a transmissive element such as a plane-parallel plate that can be exchanged easily. The reflecting surface 42 and light receiving aperture 41 on the wafer side light amount sensor 4 can be formed by, for example, patterning a metal light-shielding film made of Cr or the like on the surface of transparent substrate. The metal film may be coated with a dielectric film to increase the reflection efficiency of the reflecting portion and the transmission efficiency of the light receiving aperture.

Measurement of the reflectance of the optical element in the state in FIG. 1A will be described quantitatively. In the state in FIG. 1A, assume that an exposure amount sensor (not shown) provided in the illumination system and the wafer side light amount sensor 4 placed on the substrate stage 5 perform light amount measurement simultaneously. At this time, note that the light amount measured by the exposure amount sensor (not shown) provided in the illumination system is indicated by IN(1a) and that the light amount measured by the wafer side light amount sensor 4 is indicated by OUT(1a).

The illuminance of the light beam which illuminates the reticle 3 is the value of K·IN(1a) obtained by multiplying the light amount IN(1a) measured by the exposure amount sensor (not shown) provided in the illumination system by a measurement efficiency K determined by the position of the exposure amount sensor in the illumination system.

The illuminance of the light beam immediately after passing through the transmissive aperture pattern 31 is the value of K·IN(1a)·(GT²) where GT is the transmittance of the glass surface of the reticle 3.

The image formation magnification of the projection optical system 1 mounted in the exposure apparatus is generally a contraction such as ¼ time or ⅕ time. For the sake of simplicity, the following description will be made under an assumption that the image formation magnification of the projection optical system 1 is 1 time. A discussion on a case in which the contraction is 1/β time is apparent and is omitted accordingly.

The illuminance of the light beam immediately after being focused on the reflecting surface 42 on the wafer side light amount sensor 4 is the value of K·IN(1a)·(GT²)·PT where PT is the transmittance of the projection optical system 1. When the light amount distribution of the light beam immediately after passing through the transmissive aperture pattern 31 exhibits uniform light intensity, the light amount distribution of the light beam focused (image-formed) on the reflecting surface 42 of the wafer side light amount sensor 4 also exhibits uniform light intensity. If, however, the light beam reflected by the reflecting surface 42 is reflected again by the surface of the wafer side optical element 11 of the projection optical system 1 and reaches the light receiving aperture 41, the image of the transmissive aperture pattern 31 is defocused, and accordingly the light amount distribution of the light beam which irradiates the light receiving aperture 41 does not exhibit uniform light intensity.

If the distribution of the light intensity at the image formation position is uniform, the light intensity distribution in the defocused state widens due to the defocus of an image accompanying an increase in defocus amount, and the light intensity decreases around the image. The decrease in light amount distribution around the image caused by the defocus of the image is determined by the defocus amount and the light beam diffusion (NA) of the illumination light beam, and can be obtained easily by adding the light beam diffusion (NA) of the illumination optical beam to the light beam trace in the projection optical system 1 described above. If the aperture diameter of the transmissive aperture pattern 31 is set to be larger by the defocus amount of the image in advance, the amount of light beam which irradiates the light receiving aperture 41 can have a uniform distribution in the aperture portion of the light receiving aperture 41.

When the transmissive aperture pattern 31 is set to have a large aperture diameter in this manner, the illuminance of the light beam which illuminates the light receiving aperture 41 is K·IN(1a)·(GT²)·PT·WR·ULDR where WR is the surface reflectance of the reflecting surface 42 and ULDR is the surface reflectance of the wafer side optical element 11. The illuminance of the light beam immediately after passing through the light receiving aperture 41 is K·IN(1a)·(GT²)·PT·WR·ULDR·WT where WT is the transmittance of the light receiving aperture 41.

Assume that the wafer side light amount sensor 4 photoelectrically converts the light beam passing through the light receiving aperture 41. The light amount OUT(1a) measured by the wafer side light amount sensor 4 is expressed as:

$$OUT(1a) = K \cdot IN(1a) \cdot (GT^2) \cdot PT \cdot WR \cdot ULDR \cdot WT \cdot WK$$

where WK is the photoelectric conversion efficiency of the wafer side light amount sensor 4.

The surface reflectance ULDR of the wafer side optical element 11 is obtained from this equation by solving:

$$ULDR = \{OUT(1a)/IN(1a)\}/\{K \cdot GT^2 \cdot PT \cdot WR \cdot WT \cdot WK\} \quad (5)$$

Note that the constant terms $\{K \cdot GT^2 \cdot PT \cdot WR \cdot WT \cdot WK\}$ specific to the apparatus must be obtained in advance.

Of these constant terms, the characteristics of the following four terms can be measured by the respective units before they are built in the exposure apparatus:

the measurement efficiency K of the exposure amount sensor in the illumination system the transmittance PT of the projection optical system 1 the transmittance WT of the light receiving aperture 41 of the wafer side light amount sensor 4 the photoelectric conversion efficiency WK of the wafer side light amount sensor 4

These constant terms indicate different values depending on the angle of incidence of the light beam. Accordingly, the optical characteristics obtained for different angles of incidence must be measured by the respective units. To realize such a measurement environment requires much labor. Even if these characteristics are obtained in advance, when the units are built in the apparatus and used over a long time so that the characteristics change, the change over time of the constant terms directly adversely affects the reliability of the measurement value of the surface reflectance ULDR of the wafer side optical element 11.

Hence, it is not wise to obtain ULDR from the equation obtained in the state of FIG. 1A and including six types of constant terms specific to the apparatus. ULDR should be obtained from an equation including as fewer as possible constant terms specific to the apparatus. The reduction in constant terms can be achieved by performing measurement of FIG. 1B as well.

Measurement in the state in FIG. 1B will be described. A description similar to that of FIG. 1A will be omitted. The difference of the state in FIG. 1B from that in FIG. 1A resides in that the light beam passing through the transmissive aperture pattern 31 is directly focused on the light receiving aperture 41 of the wafer side light amount sensor 4 by the projection optical system 1, and passes through the light receiving aperture 41. Light detected by the wafer side light amount sensor 4 in the state in FIG. 1B is the second light that is incident the projection optical system 1 but not reflected by the reflecting surface 42 and the surface of the wafer side optical element 11.

Measurement in FIG. 1B will be described quantitatively. The light amount OUT(1b) measured by the wafer side light amount sensor 4 is expressed as:

$$OUT(1b) = K \cdot IN(1b) \cdot (GT^2) \cdot PT \cdot WT \cdot WK$$

where IN(1b) is the light amount measured by the exposure amount sensor (not shown) provided in the illumination system.

When the surface reflectance ULDR of the wafer side optical element 11 is calculated using the two equations (1) and (2) obtained in the states in FIGS. 1A and 1B, ULDR yields equation (3).

$$OUT(1a) = K \cdot IN(1a) \cdot (GT^2) \cdot PT \cdot WR \cdot ULDR \cdot WT \cdot WK \quad (1)$$

$$OUT(1b) = K \cdot IN(1b) \cdot (GT^2) \cdot PT \cdot WT \cdot WK \quad (2)$$

$$ULDR = \{OUT(1a)/IN(1a)/OUT(1b)/IN(1b)\} \cdot (1/WR) \quad (3)$$

It is very preferable that the surface reflectance ULDR of the wafer side optical element 11 can be obtained using only the three terms described below:

the light amounts IN(1a) and IN(1b) measured by the exposure amount sensor (not shown) provided in the illumination system the light amounts OUT(1a) and OUT(1b) measured by the wafer side light amount sensor 4 the surface reflectance WR of the reflecting surface 42 of the wafer side light amount sensor 4.

This is preferable because the characteristics unique to the apparatus which should be stored in the exposure apparatus in advance include only the surface reflectance WR of the reflecting surface 42, which is very simple. The relationship between the surface reflectance WR of the reflecting surface 42 and the angle of incidence of the measurement light is only needed to be actually measured before, for example, building the wafer side light amount sensor 4 in the apparatus, and stored in the exposure apparatus in advance. Even when the reflectance of the reflecting surface 42 decreases due to the surface contamination or the like, the contaminated reflecting surface 42 can be photo-cleaned by irradiating it with exposure light before the actual measurement. Since a change in reflectance caused by contamination can be recovered, a change over time in constant terms that adversely affects the reliability of the measurement value of ULDR does not occur easily.

As the exposure amount sensor to measure the light amounts IN(1a) and IN(1b), an exposure amount controlling sensor usually formed in the illumination system can be employed. Similarly, as the wafer side light amount sensor 4 to measure the light amounts OUT(1a) and OUT(1b), an exposure amount controlling sensor usually formed on the substrate stage can be employed.

In this manner, the surface reflectance of the wafer side optical element 11 of the projection optical system 1 can be measured by a simple arrangement of adding only the reflecting surface 42 near the wafer side light amount sensor 4 in the usually employed exposure apparatus.

The above description is made under an assumption that the both two values, that is, the transmittance WT of the light receiving aperture 41 of the wafer side light amount sensor 4 and the photoelectric conversion efficiency WK of the wafer side light amount sensor 4 are equal between the states in FIGS. 1A and 1B. Strictly, however, both the transmittance WT and photoelectric conversion efficiency WK are equivalent between the two states only when the substrate side of the projection optical system 1 is close to telecentric and the substrate side outermost optical element 11 which forms the projection optical system as the reflectance measurement target is a plane. Only under these conditions, it is possible to measure the reflectance of the optical element surface without being adversely affected by the angular characteristics (the sensor output changes depending on the angle of incidence of the light beam on the sensor) of the sensitivity of the light amount sensor.

Even when these conditions are not satisfied, no problem arise when monitoring (repeating measurement every specific period of time) a change over time in surface reflectance of the wafer side optical element 11 of the projection optical system 1. In this case, approximation is made that both the two values, that is, the transmittance WT of the light receiving aperture 41 of the wafer side light amount sensor 4 and the photoelectric conversion efficiency WK of the wafer side light amount sensor 4 are equal between the states in FIGS. 1A and 1B.

Figure 1C:
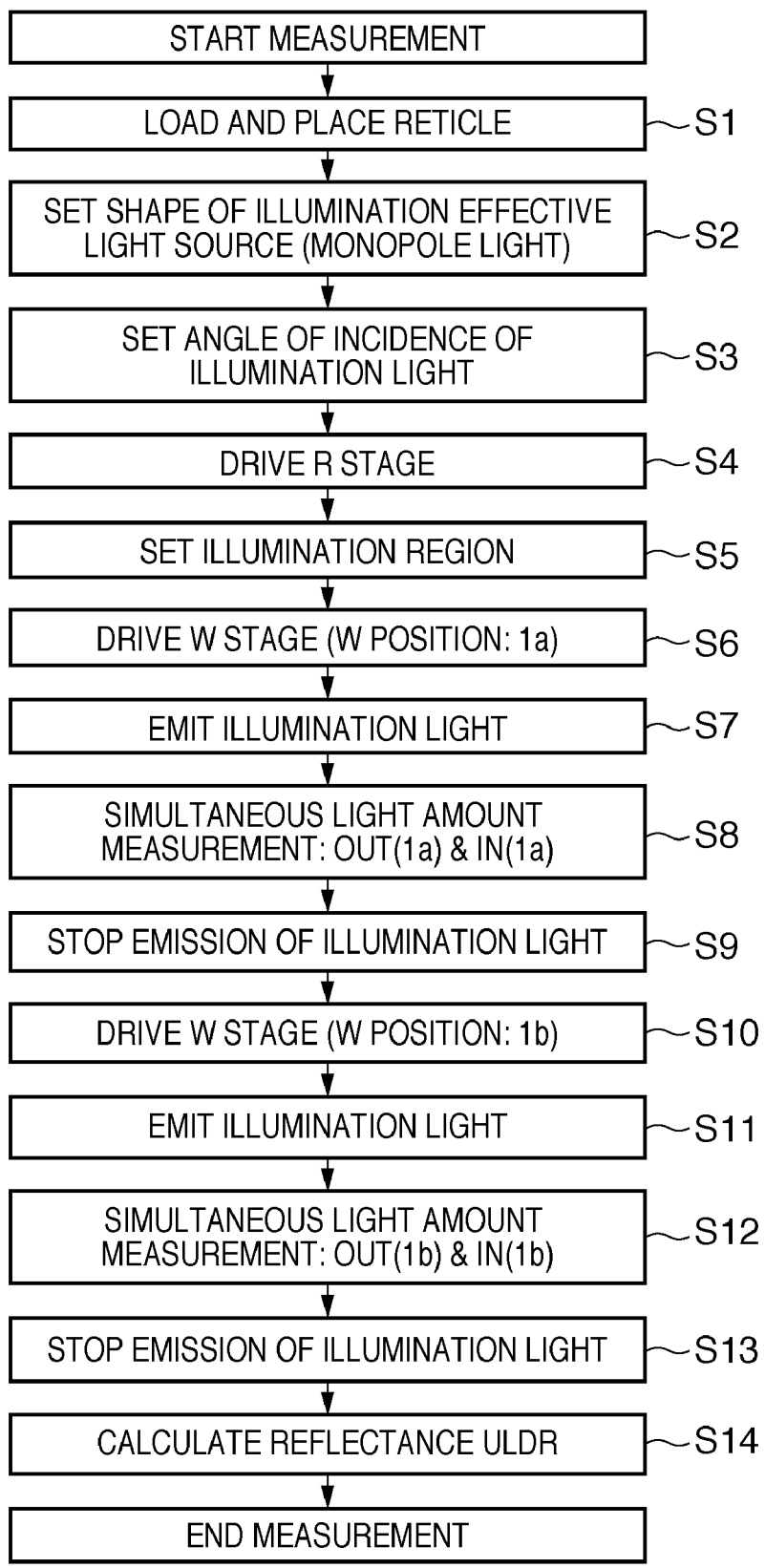
FIG. 1C is a measurement flowchart in the first embodiment.

FIG. 1C shows a reflectance measurement flowchart of the first embodiment. In step S1, the reticle transport system loads the reticle 3 and places it on the reticle stage 6. Note that the reticle 3 has a plurality of transmissive aperture patterns 31 corresponding to the plurality of image heights in the projection optical system 1. In step S2, the processor P sets the shape of the illumination effective light source. The processor P drives a mechanism that switches the effective light source shape in the illumination system to select monopole illumination light. In step S3, the processor P drives a mechanism that changes the effective light source in the illumination system 2, and sets the angle of incidence (NA) of the illumination light at a predetermined value.

In step S4, the processor P drives the reticle stage 6 so that the transmissive aperture pattern 31 coincides with the exposure region of the projection optical system 1. In step S5, the processor P sets the illumination region. The processor P drives a masking blade in the illumination system 2 so that the illumination system 2 illuminates only a transmissive aperture pattern 31 with an image height to be measured, and its periphery. In step S6, the processor P drives the substrate stage 5 to be in the state in FIG. 1A, that is, to such a position that the light beam, after passing through the transmissive aperture pattern 31, is reflected by the reflecting surface 42 and the surface of the wafer side optical element 11, passes through the light receiving aperture 41 of the wafer side light amount sensor 4. In step S7, the processor P oscillates a light source laser or the like to irradiate the reticle 3 with the illumination light. In step S8, the exposure amount sensor (not shown) provided in the illumination system and the wafer side light amount sensor 4 placed on the substrate stage 5 measure the light amounts OUT(1a) and IN(1a) simultaneously. In step S9, the processor P stops oscillation of the light source laser or the like so the reticle is not irradiated with the illumination light.

In step S10, the processor P drives the substrate stage 5 to the position in FIG. 1B, that is, to such a position that the light beam, after passing through the transmissive aperture pattern 31, directly passes through the light receiving aperture 41 of the wafer side light amount sensor 4. In step S11, the processor P oscillates the light source laser or the like to irradiate the reticle 3 with the illumination light. In step S12, the exposure amount sensor (not shown) provided in the illumination system and the wafer side light amount sensor 4 placed on the substrate stage 5 measure the light amounts OUT(1b) and IN(1b) simultaneously. In step S13, the processor P stops oscillation of the light source laser or the like so the reticle is not irradiated with the illumination light.

In step S14, the processor P calculates the surface reflectance ULDR from the measurement values OUT(1b), IN(1b), OUT(1a), and IN(1a) and the characteristic value of the angle of incidence of the surface reflectance WR of the reflecting surface 42 stored in the apparatus in advance by considering the angle of incidence at the time of measurement.

Second Embodiment

Measurement of the reflectance of a reticle side optical element 12 of a projection optical system 1 will be described with reference to FIGS. 2A to 2C. A description similar to that for FIGS. 1A and 1B is omitted.

Measurement in the state in FIG. 2A will be described. Light emitted by a light source 22 in an illumination system 2 is shaped by an illumination optical system 21 into a monopole obliquely incident light beam, and illuminates a transmissive aperture pattern 32 formed in a reticle 3.

The light beam passing through the transmissive aperture pattern 32 is reflected by the surface of the reticle side optical element 12 of the projection optical system 1 and then by a reflecting region 36 on the upper surface of the reticle which is formed on the reticle 3, and enters the projection optical system 1. The light beam entering the projection optical system 1 is guided to a light receiving aperture 41 of the wafer side light amount sensor 4. The light beam passing through the light receiving aperture 41 is received by the wafer side light amount sensor 4 and photoelectrically converted.

The reticle side optical element 12 which is the outermost in the projection optical system 1 is often a transmitting element such as a plane-parallel plate that can be exchanged easily. At this time, a substrate stage 5 has been driven to a position calculated in advance such that an obliquely incident light beam enters the light receiving aperture 41. More specifically, while the vertical position of the light receiving aperture 41 of the wafer side light amount sensor 4 is kept on the image plane of the projection optical system 1, the substrate stage 5 is driven in the horizontal direction (within a plane perpendicular to the surface of the sheet), so that the obliquely incident light beam coincides with the light receiving aperture 41.

The image plane of the projection optical system 1 is set at a position where the pattern on the lower surface of the reticle 3 forms an image on the wafer side, that is, is set at the same vertical position as that of the substrate stage 5 in the state in FIG. 1A. The image of the transmissive aperture pattern 32 is defocused at the position of the light receiving aperture 41 of the wafer side light amount sensor 4.

To obtain a uniform distribution in the aperture portion of the light receiving aperture 41, the transmissive aperture pattern 32 is illuminated by a uniform light intensity, and the aperture diameter of the transmissive aperture pattern 32 is set to be larger than the light receiving aperture 41 by the defocus amount of the image in advance. The defocus amount of the transmissive aperture pattern 31 shown in FIG. 1A and that of the transmissive aperture pattern 32 shown in FIG. 2A differ at the position of the light receiving aperture 41 of the wafer side light amount sensor 4. Therefore, the aperture diameter of the transmissive aperture pattern 31 is different from that of the transmissive aperture pattern 32.

Measurement of FIG. 2A will be described quantitatively. In the state in FIG. 2A, assume that an exposure amount sensor (not shown) provided in the illumination system and the wafer side light amount sensor 4 placed on the substrate stage 5 perform light amount measurement simultaneously. At this time, note that the light amount measured by the exposure amount sensor (not shown) provided in the illumination system is indicated by IN(2a) and that the light amount measured by the wafer side light amount sensor 4 is indicated by OUT(2a). In FIG. 2A, the illuminance of the light beam immediately after passing through the transmissive aperture pattern 32 is the value of $K \cdot IN(1a) \cdot (GT^2)$ in the same manner as in FIG. 1A.

The illuminance of the light beam which irradiates the light receiving aperture 41 is the value of $K \cdot IN(1a) \cdot (GT^2) \cdot ULUR \cdot GT \cdot CUR \cdot GT \cdot PT$ where ULUR is the surface reflectance of the reticle side optical element 12 and CUR is the reticle inner surface reflectance of the reticle upper surface reflecting region 36.

Hence, the light amount OUT(2a) measured by the wafer side light amount sensor 4 is expressed as:

$$OUT(2a) = K \cdot IN(1a) \cdot (GT^4) \cdot ULUR \cdot CUR \cdot PT \cdot WT \cdot WK$$

Measurement in the state in FIG. 2B will be described. The difference of the state in FIG. 2B from that in FIG. 2A resides in that the light beam passing through the transmissive aperture pattern 32 is directly focused on the light receiving aperture 41 of the wafer side light amount sensor 4 by the projection optical system 1 without being reflected by the surface of the reticle side optical element 12, and passes through the light receiving aperture 41.

Measurement in FIG. 2B will be described quantitatively. A light amount OUT(2b) measured by the wafer side light amount sensor 4 is expressed as:

$$\mathrm{OUT}(2b) = K \cdot \mathrm{IN}(2b) \cdot (GT^2) \cdot PT \cdot WT \cdot WK$$

where IN(2b) is the light amount measured by the exposure amount sensor (not shown) provided in the illumination system.

Figure 2A:
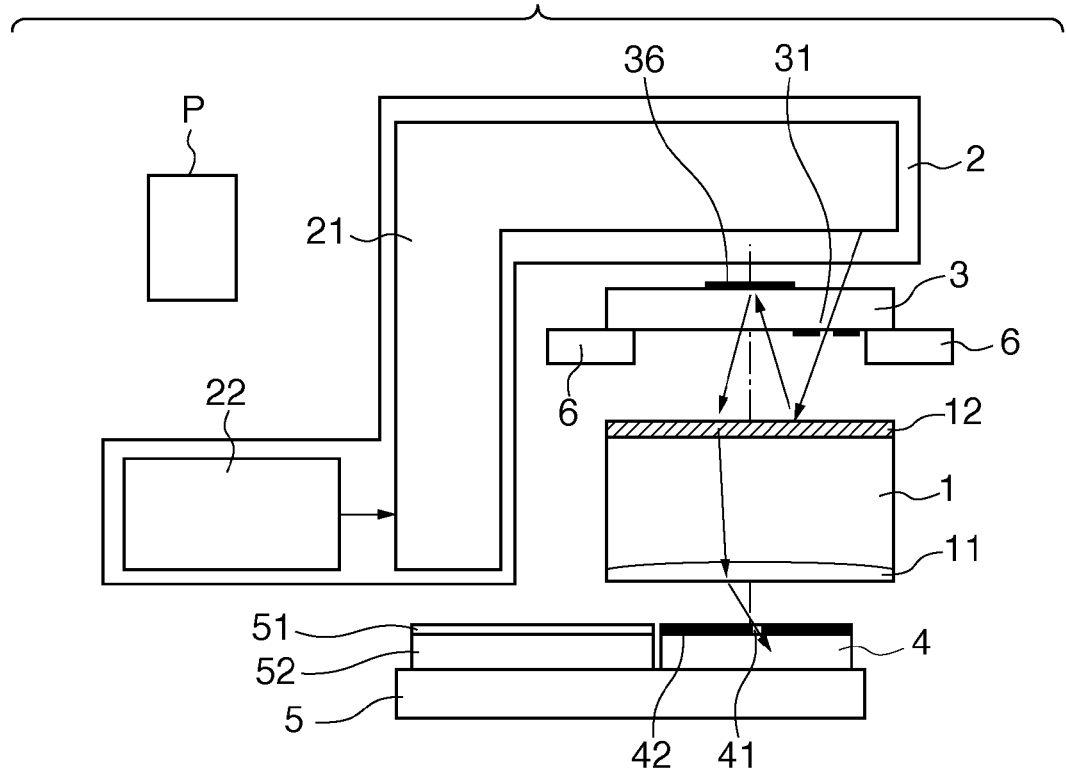
FIG. 2A is a view for explaining an exposure apparatus according to the second embodiment.
Figure 2B:
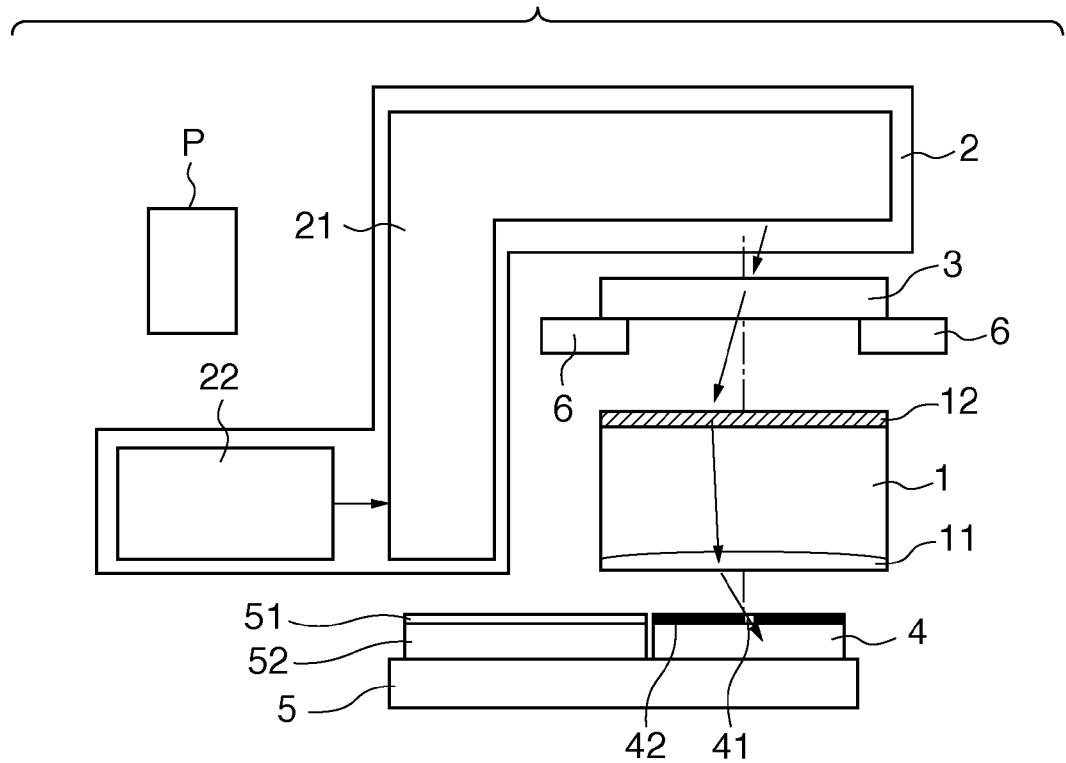
FIG. 2B is a view for explaining an exposure apparatus according to the second embodiment.

When the surface reflectance ULUR of the reticle side optical element 12 is calculated using the two equations (4) and (5) obtained in the states in FIGS. 2A and 2B, ULUR yields equation (6).

$$\mathrm{OUT}(2a) = K \cdot \mathrm{IN}(2a) \cdot (GT^4) \cdot ULUR \cdot CUR \cdot PT \cdot WT \cdot WK \quad (4)$$

$$\mathrm{OUT}(2b) = K \cdot \mathrm{IN}(2b) \cdot (GT^2) \cdot PT \cdot WT \cdot WK \quad (5)$$

$$ULUR = \{\mathrm{OUT}(1a)/\mathrm{IN}(1a)/\mathrm{OUT}(1b)/\mathrm{IN}(1b)\} \cdot \{1/(GT^2 \cdot CUR)\} \quad (6)$$

It is very preferable that the surface reflectance ULUR of the reticle side optical element 12 can be obtained using only the three terms described below:
- the light amounts IN(2a) and IN(2b) measured by the exposure amount sensor (not shown) provided in the illumination system
- the light amounts OUT(2a) and OUT(2b) measured by the wafer side light amount sensor 4
- a glass surface transmittance GT of the reticle 3 and the reticle inner surface reflectance CUR of the reticle upper surface reflecting region 36.

This is preferable because the characteristics unique to the apparatus which should be stored in the exposure apparatus in advance include only the glass surface transmittance GT of the reticle 3 and the reticle inner surface reflectance CUR of the reticle upper surface reflecting region 36, which is very simple. The relationship among the glass surface transmittance GT, the reticle inner surface reflectance CUR, and the angle of incidence of the measurement light is only needed to be actually measured using the reticle 3 alone, and stored in the exposure apparatus in advance. At this time, the relationship among the glass surface transmittance GT, the reticle inner surface reflectance CUR, and the angle of incidence of the measurement light may be obtained by calculation in the exposure apparatus using the optical property value of the glass material of the reticle 3 and that of the reticle upper surface reflecting region. Even when the reticle 3 is erroneously contaminated, it does not influence the reticle inner surface reflectance CUR. Since the glass surface transmittance GT can be recovered easily by cleaning the reticle 3 with a cleaning unit, a change over time in constant terms that adversely affects the reliability of the measurement value of ULUR does not occur easily.

The above description is made under an assumption that the both two values, that is, a transmittance WT of the light receiving aperture 41 of the wafer side light amount sensor 4 and a photoelectric conversion efficiency WK of the wafer side light amount sensor 4 are equal between the states in FIGS. 2A and 2B. Strictly, however, both the transmittance WT and photoelectric conversion efficiency WK are equivalent between the two states only when the reticle side of the projection optical system 1 is close to telecentric and the reticle side outermost optical element 12 which forms the projection optical system as the reflectance measurement target is a plane. Only under these conditions, it is possible to perform the measurement without being adversely affected by the angular characteristics (the sensor output changes depending on the angle of incidence of the light beam on the sensor) of the sensitivity of the light amount sensor.

Even when these conditions are not satisfied, no problem arise when monitoring (repeating measurement every specific period of time) a change over time in surface reflectance of the reticle side optical element 12 of the projection optical system 1. In this case, approximation is made that the both two values, that is, the transmittance WT of the light receiving aperture 41 of the wafer side light amount sensor 4 and the photoelectric conversion efficiency WK of the wafer side light amount sensor 4 are equal between the states in FIGS. 2A and 2B.

Figure 2D:
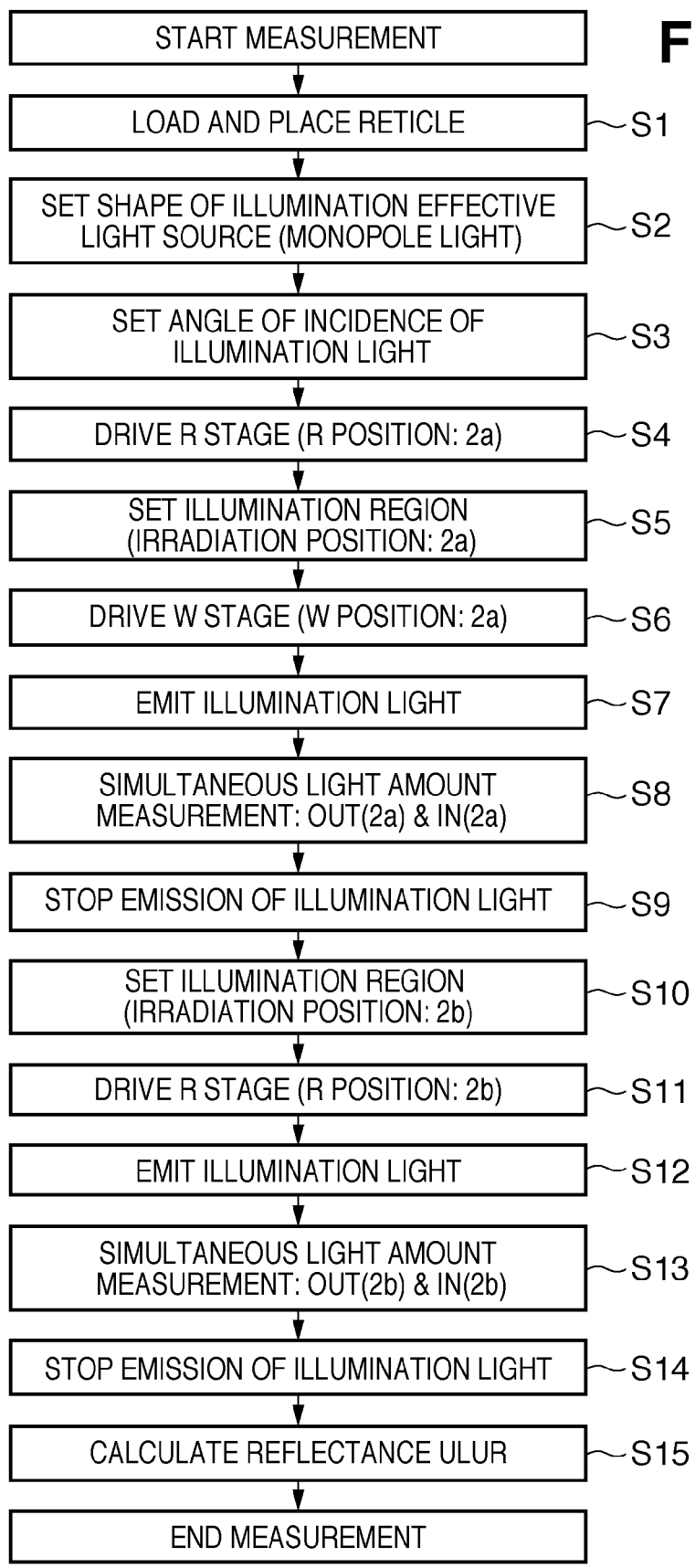
FIG. 2D is a measurement flowchart in the second embodiment.

FIG. 2D shows a flowchart of the measurement of the surface reflectance of the reticle side optical element 12 in the second embodiment.

In step S1, the reticle transport system loads the reticle 3 and places it on a reticle stage 6. Note that the reticle 3 has a plurality of transmissive aperture patterns 32 corresponding to the plurality of image heights in the projection optical system 1. In step S2, the shape of the illumination effective light source is set. A processor P drives a mechanism that switches the effective light source shape in the illumination system to select monopole illumination light. In step S3, the processor P drives a mechanism that changes the effective light source in the illumination system 2, and sets the angle of incidence (NA) of the illumination light at a predetermined value.

In step S4, the processor P drives the reticle stage 6 so that the transmissive aperture pattern 32 coincides with the exposure region of the projection optical system 1. In step S5, the processor P sets the illumination region. The processor P drives a masking blade in the illumination system 2 so that the illumination system 2 illuminates only the transmissive aperture pattern 32 with an image height to be measured, and its periphery. In step S6, the processor P drives the substrate stage 5 to such a position that the light beam, after passing through the transmissive aperture pattern 32 shown in FIG. 2A and reflected by the reticle side optical element 12 and reflecting region 36, is guided to the light receiving aperture 41 of the wafer side light amount sensor 4 through the projection optical system 1. In step S7, the processor P oscillates a light source laser or the like to irradiate the reticle 3 with the illumination light. In step S8, the exposure amount sensor (not shown) provided in the illumination system and the wafer side light amount sensor 4 placed on the substrate stage 5 measure the light amounts OUT(2a) and IN(2a) simultaneously. In step S9, the processor P stops oscillation of the light source laser or the like so the reticle is not irradiated with the illumination light. In step S10, the processor P drives the masking blade in the illumination system 2 to illuminate only the light receiving aperture 41 of the wafer side light amount sensor 4 and its vicinity.

In step S11, the processor P drives the reticle stage 6 to the state in FIG. 2B, that is, such that the transmitting portion is positioned in the exposure region of the projection optical system 1 (to avoid the transmissive aperture pattern 32). In step S12, the light source laser or the like is oscillated to irradiate the reticle 3 with the illumination light. In step S13, the exposure amount sensor (not shown) provided in the illumination system and the wafer side light amount sensor 4 placed on the substrate stage 5 measure the light amounts OUT(2b) and IN(2b) simultaneously. In step S14, the processor P stops oscillation of the light source laser or the like so the reticle is not irradiated with the illumination light.

In step S15, the processor P calculates ULUR from the measurement values OUT(1b), IN(1b), OUT(1a), and IN(1a), and the glass surface transmittance GT and the characteristic value of the angle of incidence of the reticle inner surface reflectance CUR stored in the apparatus in advance by considering the angle of incidence at the time of measurement.

Figure 2E:
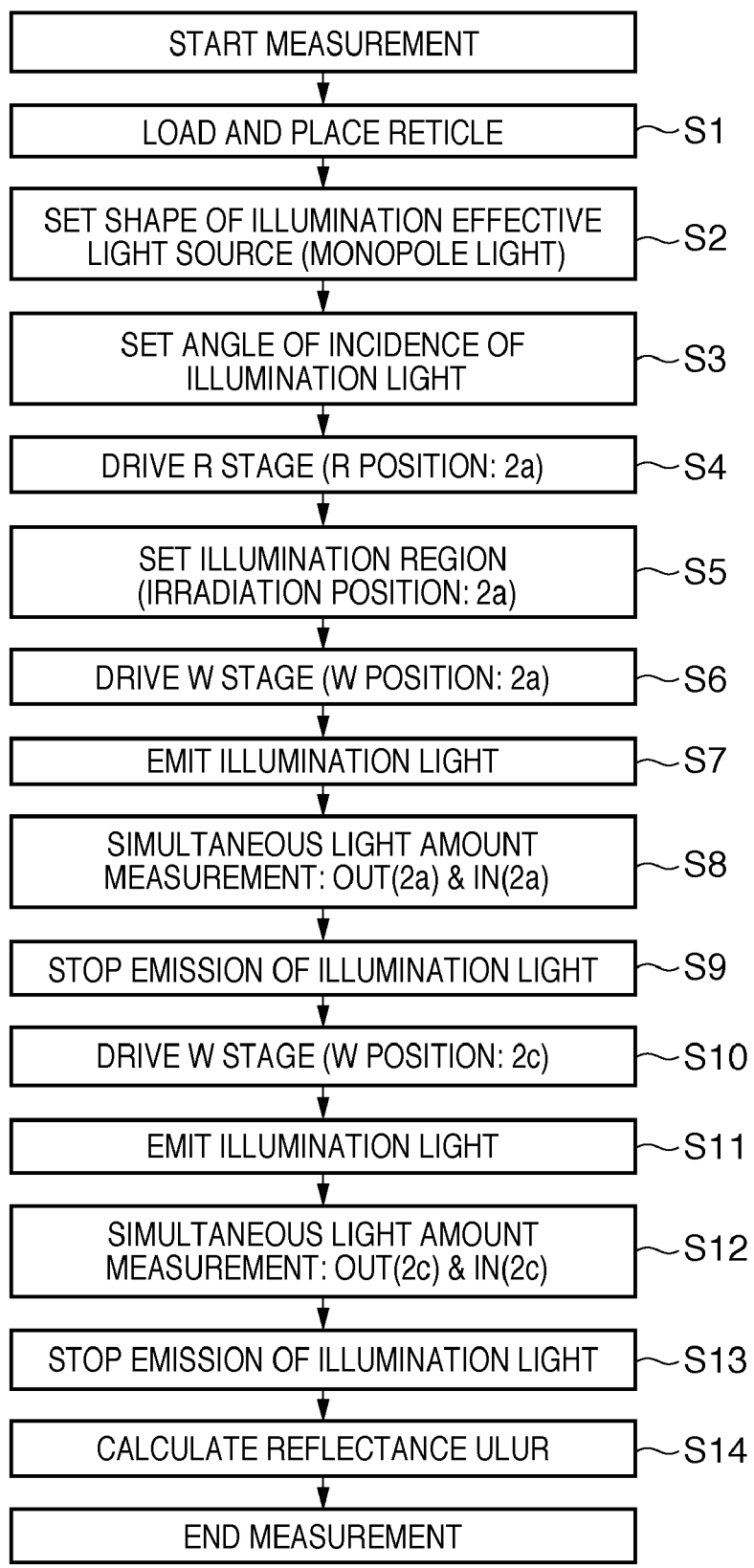
FIG. 2E is a measurement flowchart in the second embodiment.

In the second embodiment, the flowchart of the measurement of the surface reflectance of the reticle side optical element can be modified as in FIG. 2E. The difference in measurement flowchart between FIGS. 2E and 2D is equivalent to the difference in state between FIG. 2C, which describes reference measurement, and FIG. 2B. In FIG. 2B, the optical path of the measurement light beam passing in the projection optical system 1 is identical to that in FIG. 2A. Hence, between the states in FIGS. 2B and 2A, the position of the reticle 3 and the setting of the illumination range differ. In contrast to this, in FIG. 2C, although the optical path of the measurement light beam passing in the projection optical system 1 differs, the position of the reticle and the illumination range are identical to those in FIG. 2A. Therefore, the position of the substrate stage 5 differs between the states in FIGS. 2C and 2A. The difference between FIGS. 1B and 2C is equivalent to the difference between the transmissive aperture patterns 31 and 32.

Note that the transmittance of the projection optical system 1 is indicated by PT in FIG. 2A and PT' in FIG. 2C.

When the surface reflectance ULUR of the reticle side optical element 12 is calculated using the two equations (4) and (7) obtained in the states in FIGS. 2A and 2C, ULUR yields equation (8).

$$OUT(2a)=K\cdot IN(2a)\cdot (GT^4)\cdot ULUR\cdot CUR\cdot PT\cdot WT\cdot WK \quad (4)$$

$$OUT(2c)=K\cdot IN(2c)\cdot (GT^2)\cdot PT'\cdot WT\cdot WK \quad (7)$$

$$ULUR=\{OUT(2a)/IN(2a)/OUT(2c)/IN(2c)\}\cdot \{1/(GT^2\cdot CUR)\}\cdot \{PT'/PT\} \quad (8)$$

The transmittance ULUR may be calculated under an assumption that the transmittances PT and PT' of the projection optical system 1 satisfy $\{PT'/PT\}\approx 1$. Alternatively, PT and PT' may be measured in advance with the projection optical system 1 before being mounted in the apparatus, and stored in the exposure apparatus. For example, when monitoring a change over time in surface reflectance of the reticle side optical element 12, it is important to correctly measure a change in measurement value of the reflectance. It does not matter if the initial value of the measurement value of the reflectance is slightly different from the true value. To monitor a change over time means to repeat measurement every specific period of time. The true value is, for example, a measurement value obtained by extracting only the element in question and measuring it with a different measurement unit. In this case, no problem arises when ULUR is calculated under an assumption that $\{PT'/PT\}\approx 1$.

Third Embodiment

Measurement of the reflectances of optical elements 13 and 14 in a projection optical system 1 according to the present invention will be described with reference to FIGS. 3 and 4.

Measurement in the state in FIG. 3 will be described. The state in FIG. 3 is different from that in FIG. 1A in a transmissive aperture pattern 33 formed in a reticle 3 and in the position of a substrate stage 5. FIG. 3 shows a state in which the light beam reflected by a reflecting surface 42 is reflected by a wafer side optical element 11 of the projection optical system 1 again and a state in which the light beam reflected by the reflecting surface 42 is reflected by the optical element 13 in the projection optical system 1. The position (in the horizontal direction) of the light beam reflected by the optical element 11 and returning to a wafer side light amount sensor 4 is different from that of the light beam reflected by the optical element 13 and returning to the wafer side light amount sensor 4. Hence, if the aperture diameter of the transmissive aperture pattern 33 is optimized, the substrate stage 5 can be driven to such a position that only the light beam reflected by the optical element 13 passes through a light receiving aperture 41, so that the light beams respectively reflected by the two optical elements 11 and 13 do not mix with each other.

Measurement of FIG. 3 will be described quantitatively.

Assuming that the transmittances of the wafer side optical element 11 and optical element 13 of the projection optical system 1 are respectively indicated by T11 and R13, $$OUT(3a)=K\cdot IN(3a)\cdot (GT^2)\cdot (T11^2)\cdot R13\cdot PT\cdot WR\cdot WT\cdot WK$$

is obtained.

When reference measurement (in FIG. 1B, only the transmissive aperture pattern 31 of the reticle 3 is replaced by the transmissive aperture pattern 33) similar to that in FIG. 1B is performed, $$OUT(3b)=K\cdot IN(3b)\cdot (GT^2)\cdot PT'\cdot WT\cdot WK$$

is obtained.

From the two equations, $$R13\cdot (T11^2)=\{OUT(3a)/IN(3a)/OUT(3b)/IN(3b)\}\cdot \{1/WR\}$$

is obtained.

By assuming $T11\approx 1$, $$R13\approx \{OUT(3a)/IN(3a)/OUT(3b)/IN(3b)\}\cdot \{1/WR\}$$

is obtained.

With approximation of $T11\approx 1$, no problem arises when monitoring (repeating measurement every specific period of time) a change over time in surface reflectance R13 of the optical element 13. In this manner, the surface reflectance R13 of the optical element 13 can also be obtained using an equation which is the same as that for the surface reflectance ULDR of the optical element 11 shown in the first embodiment.

Measurement in the state in FIG. 4 will now be described. The state in FIG. 4 is different from that in FIG. 2A in a transmissive aperture pattern 34 formed in the reticle 3 and in the position of the substrate stage 5.

Assuming that the transmittances of the reticle side optical element 12 and optical element 14 of the projection optical system 1 are respectively indicated by T12 and R14, $$OUT(4a)=K\cdot IN(4a)\cdot (GT^4)\cdot (T12^2)\cdot R14\cdot PT\cdot WT\cdot WK$$

is obtained.

When reference measurement (in FIG. 2C, only the transmissive aperture pattern 31 of the reticle 3 is replaced by the transmissive aperture pattern 34) similar to that in FIG. 2C is performed, $$OUT(4b)=K\cdot IN(3b)\cdot (GT^2)\cdot PT'\cdot WT\cdot WK$$

is obtained.

From the two equations, $$R14 \cdot (T12^2) = \{OUT(4a)/IN(4a)/OUT(4b)/IN(4b)\} \cdot \{1/(GT^2 \cdot CUR)\}$$

is obtained. At this time, reference measurement may alternatively be performed in the state in FIG. 2B.

Furthermore, by assuming $T12 \approx 1$, $$R14 \approx \{OUT(4a)/IN(4a)/OUT(4b)/IN(4b)\} \cdot \{1/(GT^2 \cdot CUR)\}$$

is obtained.

In this manner, the surface reflectance R14 of the optical element 14 can also be obtained using an equation which is the same as that for the surface reflectance ULUR of the optical element 12 shown in the second embodiment.

Figure 3:
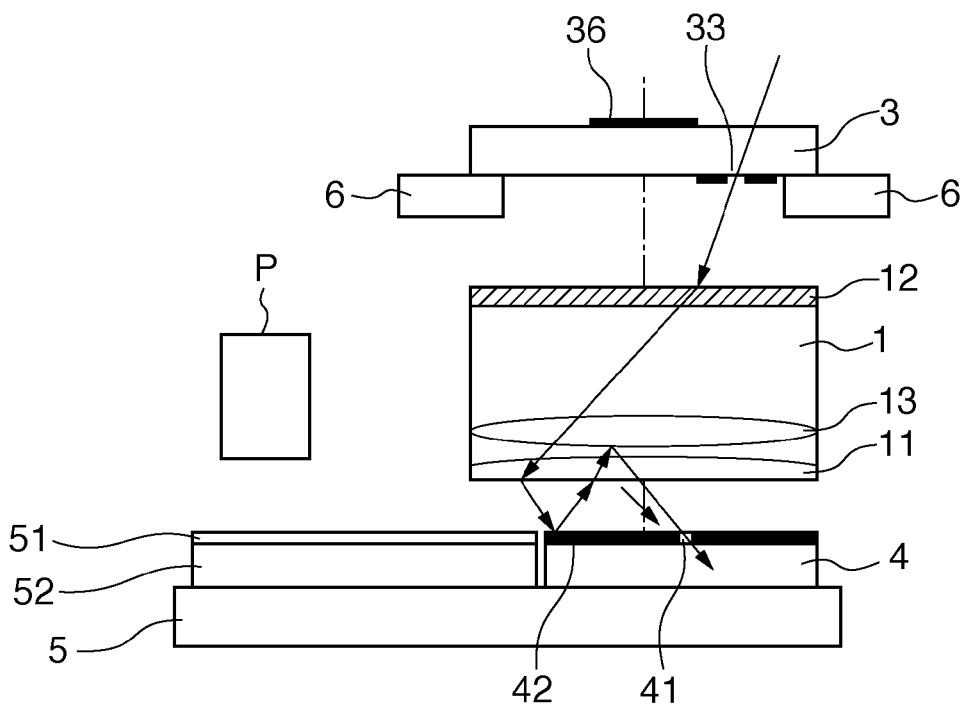
FIG. 3 is a view for explaining an exposure apparatus according to the third embodiment.
Figure 4:
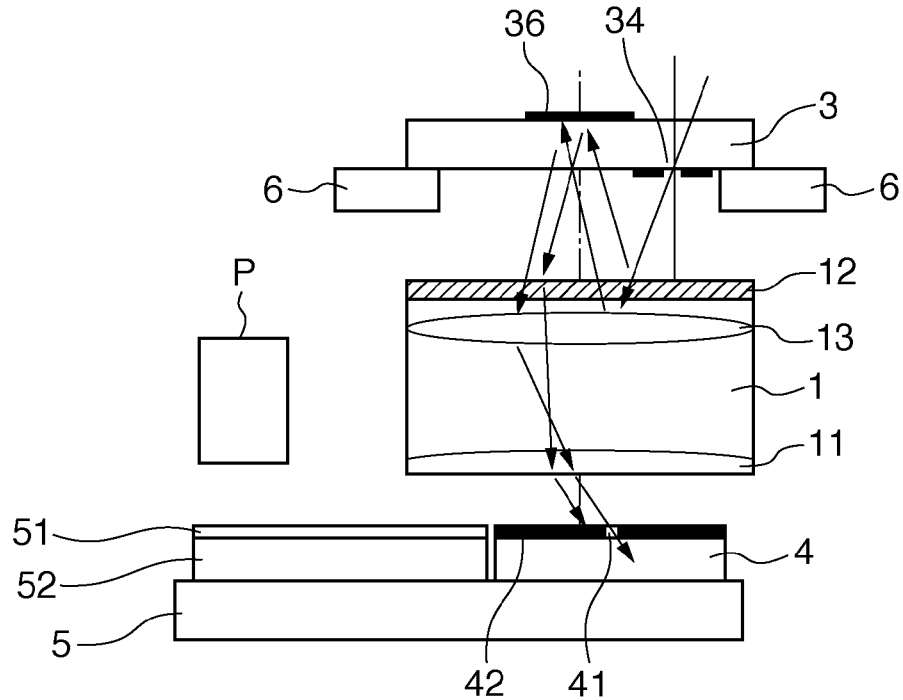
FIG. 4 is a view for explaining the exposure apparatus according to the third embodiment.

Whether or not to measure the surface reflectance of the optical element in the projection optical system 1 by measurement similar to that in FIG. 3A or 4 may be determined from the following two respects based on the lens design data on the projection optical system 1:

the light receiving amount of the wafer side light amount sensor 4 the degree of separation from the reflected measurement light from other surfaces If the reflected measurement light from other surfaces cannot be separated by only measurement similar to that in FIG. 3 or 4, that is, by only one type of measurement, the following process may be performed.

Assume a case in which, for example, reflected measurement light R15 and reflected measurement light R16 from two surfaces mix in the light receiving amount of the wafer side light amount sensor 4.

When R15 and R16 are measured by two types of measurements similar to those in FIGS. 3 and 4, the following two equations are obtained:

$$R15 + R16 \approx \{OUT(3a)/IN(3a)/OUT(3b)/IN(3b)\} \cdot \{1/WR\}$$

$$R15 + R16 \approx \{OUT(4a)/IN(4a)/OUT(4b)/IN(4b)\} \cdot \{1/(GT^2 \cdot CUR)\}$$

When these simultaneous equations are solved, the reflectances R15 and R16 can be obtained.

If a plurality of types of reflected measurement light mix, simultaneous equations corresponding in number to the variables to be obtained may be solved by performing a plurality of measurement operations with different states, for example, the transmissive aperture pattern to be measured includes a plurality of image heights. Then, the reflectances of the plurality of reflecting surfaces can be obtained.

Fourth Embodiment

Figure 5:
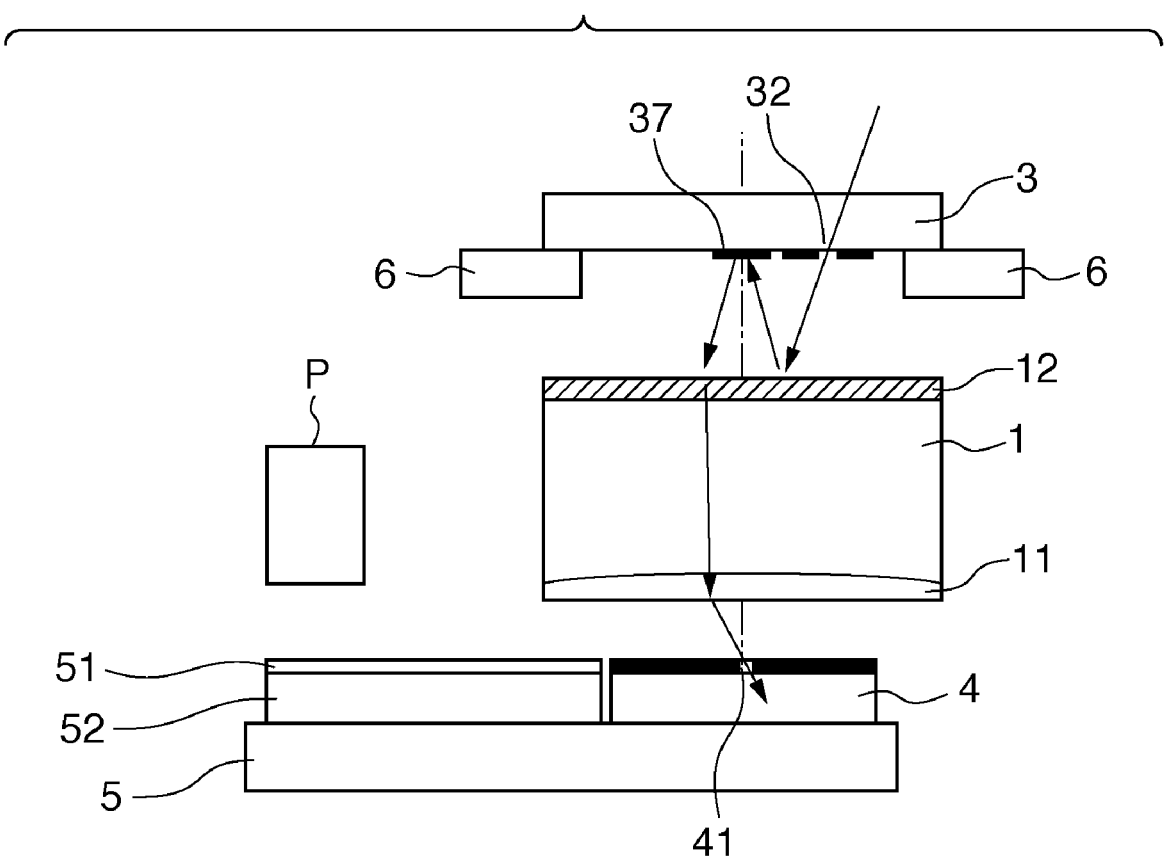
FIG. 5 is a view for explaining an exposure apparatus according to the fourth embodiment.

FIG. 5 shows another embodiment of FIG. 2A. In FIG. 2A, the light beam passing through the transmissive aperture pattern 32 is reflected by the surface of the reticle side optical element 12 of the projection optical system 1 and then by the reticle inner surface at the reflecting region 36 on the reticle upper surface which is formed on the reticle 3, and enters the projection optical system 1. In FIG. 5, in place of the reflecting region 36 on the reticle upper surface in FIG. 2A, the light beam is reflected by a reflecting region 37 on the reticle lower surface. In FIG. 2A, reflection by the reticle inner surface of the reflecting region 36 on the reticle upper surface is employed because with the reflection by the reticle inner surface, reflectance does not largely change over time. Deterioration over time in reflectance of the reticle reflecting region can be decreased by, for example, cleaning the reticle periodically. No problem arises if the light beam is reflected by the reflecting region 37 on the reticle lower surface shown in FIG. 5.

A metal light-shielding film such as a single- or double-layer Cr film may be formed on the reflecting region 36 on the reticle upper surface in FIG. 2A. The double-layer Cr film contains Cr on the reticle inner surface side and Cr oxide or the like on the reticle outer surface side, thus forming an anti-reflection layer. With the reflecting region 36 on the reticle upper surface in FIG. 2A, regardless of whether the light-shielding film is a single-layer Cr film or double-layer Cr film, because the reticle inner surface is formed of Cr, a high reflectance of about 40% can be obtained. In contrast to this, if the reflecting region 37 on the reticle lower surface in FIG. 5 is a general double-layer Cr film, the resultant reflectance is as low as several %, which is not desirable. Desirably, the reflecting region 37 on the reticle lower surface in FIG. 5 is formed of a single-layer Cr film, or a metal light-shielding film with a higher reflectance on the air side.

Fifth Embodiment

Figure 6A:
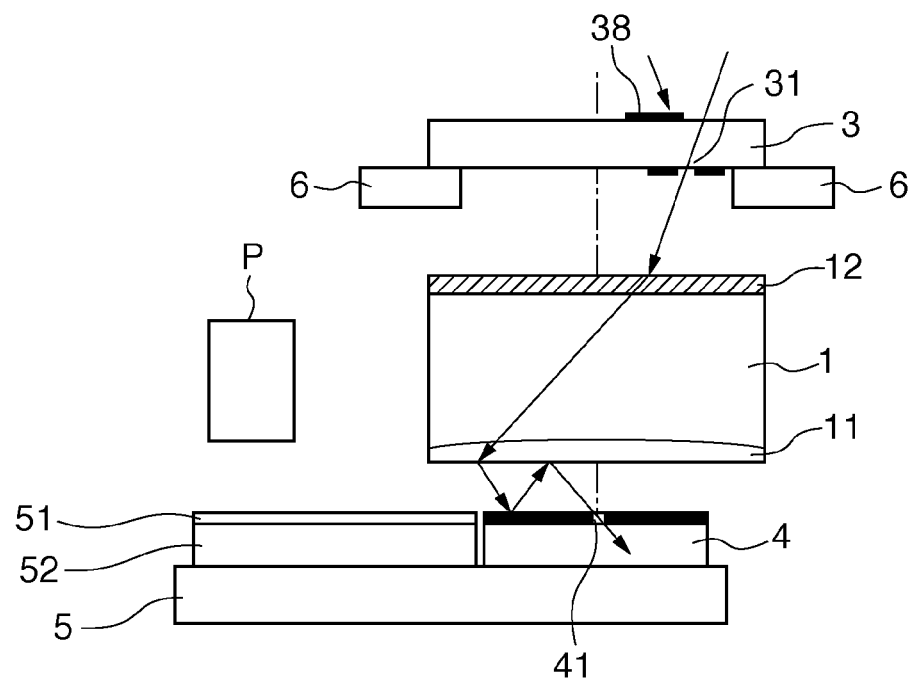
FIG. 6A is a view for explaining an exposure apparatus according to the fifth embodiment.
Figure 6B:
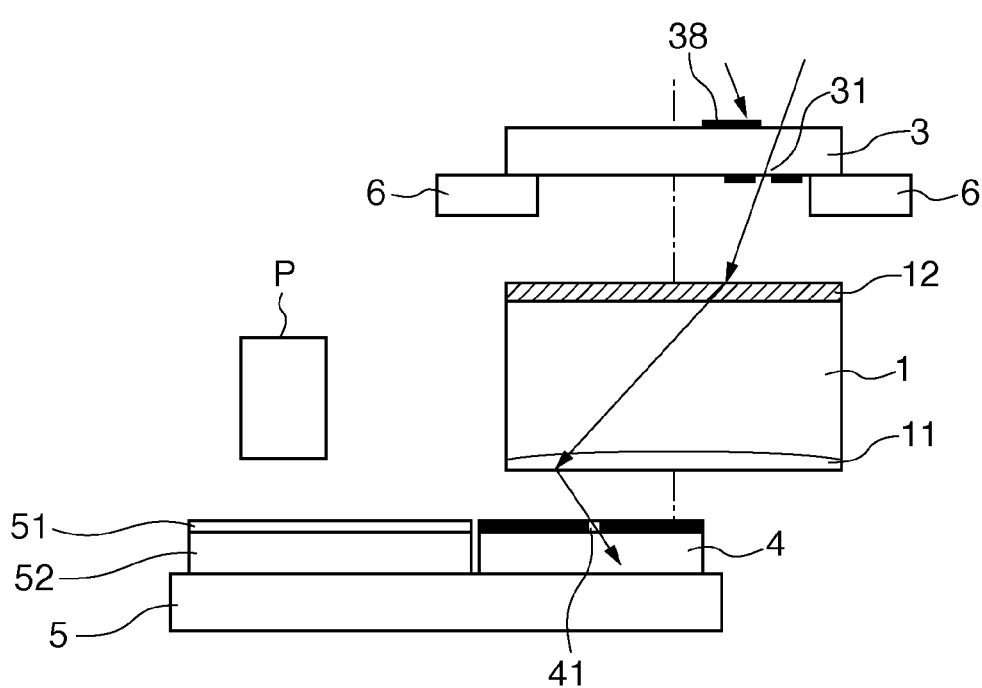
FIG. 6B is a view for explaining the exposure apparatus according to the fifth embodiment.

FIGS. 6A and 6B show other examples of FIGS. 1A and 1B. In FIGS. 1A and 1B, the illumination optical system 21 forms a monopole obliquely incident light beam. In the illumination system 2, an exclusive stop or CGH must be formed in the turret in advance, and the turret must be switched for measurement. FIGS. 6A and 6B show a state in which an illumination optical system 21 forms a dipole obliquely incident light beam to illuminate a reticle 3. Dipole illumination is provided in the exposure apparatus as standard equipment in the exposure apparatus to serve micropattern transfer.

Figure 7A:
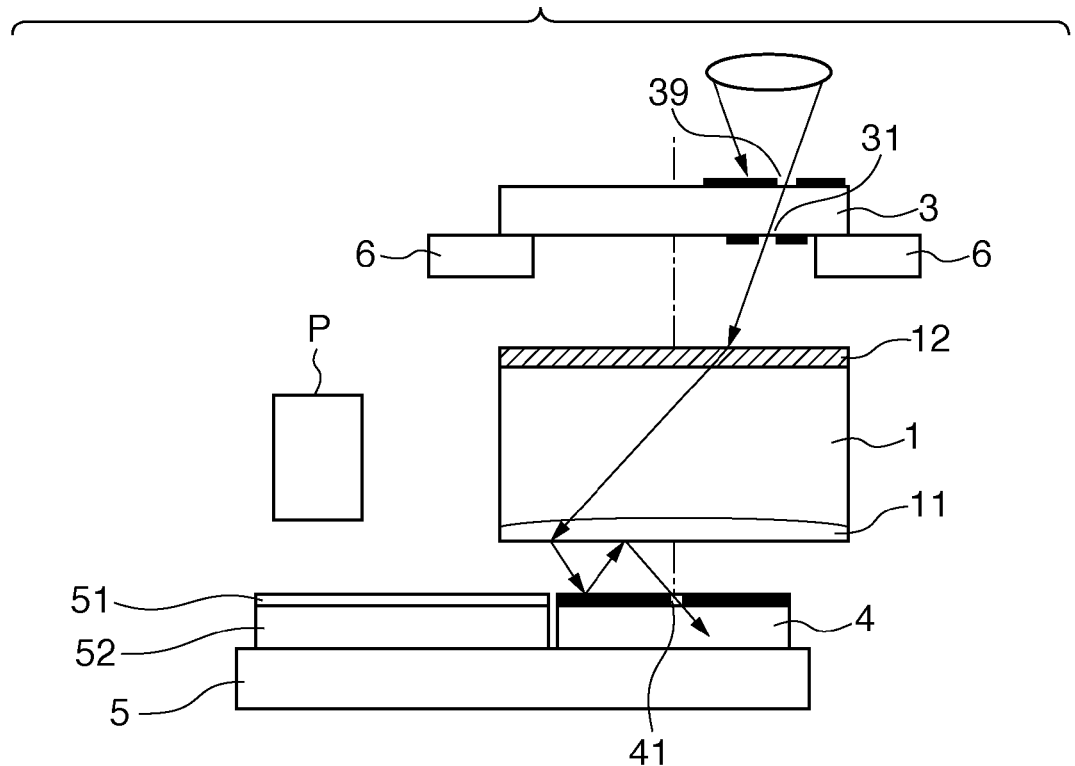
FIG. 7A is a view for explaining the exposure apparatus according to the fifth embodiment.
Figure 7B:
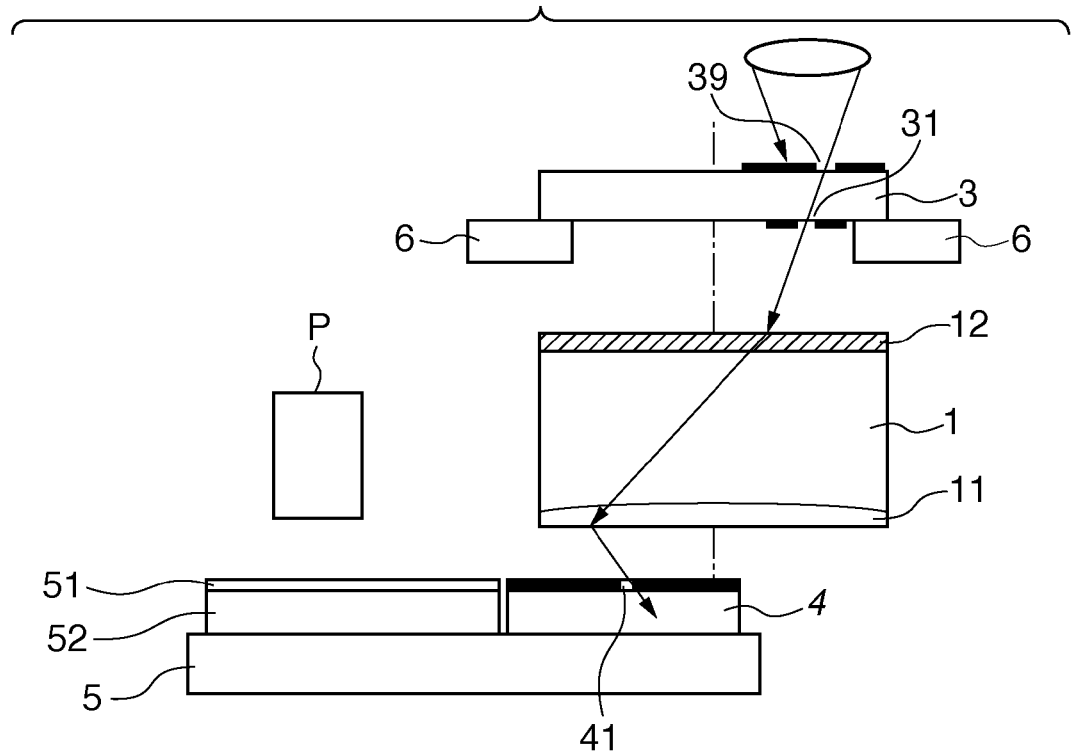
FIG. 7B is a view for explaining the exposure apparatus according to the fifth embodiment.

At this time, a reticle upper surface light-shielding region 38 on the upper surface of the reticle 3 shields one part of a dipole illumination to monopole-illuminate a transmissive aperture pattern 32. FIGS. 7A and 7B show a case in which an annular illumination provided in the exposure apparatus as standard equipment illuminates the reticle 3 by oblique illumination. A reticle upper surface aperture region 39 is formed on the upper surface of the reticle 3 to pass only a light beam that monopole-illuminates the transmissive aperture pattern 32. At this time, optically, the transmissive aperture pattern 32 serves as a field stop, and the reticle upper surface aperture region 39 serves as an aperture stop.

The illumination condition shown in FIGS. 6A and 6B can be changed to a cross pole illumination or the like. The illumination condition shown in FIGS. 7A and 7B can be changed to a uniform illumination ($\sigma = 0.8$), as a matter of course.

Sixth Embodiment

Figure 8:
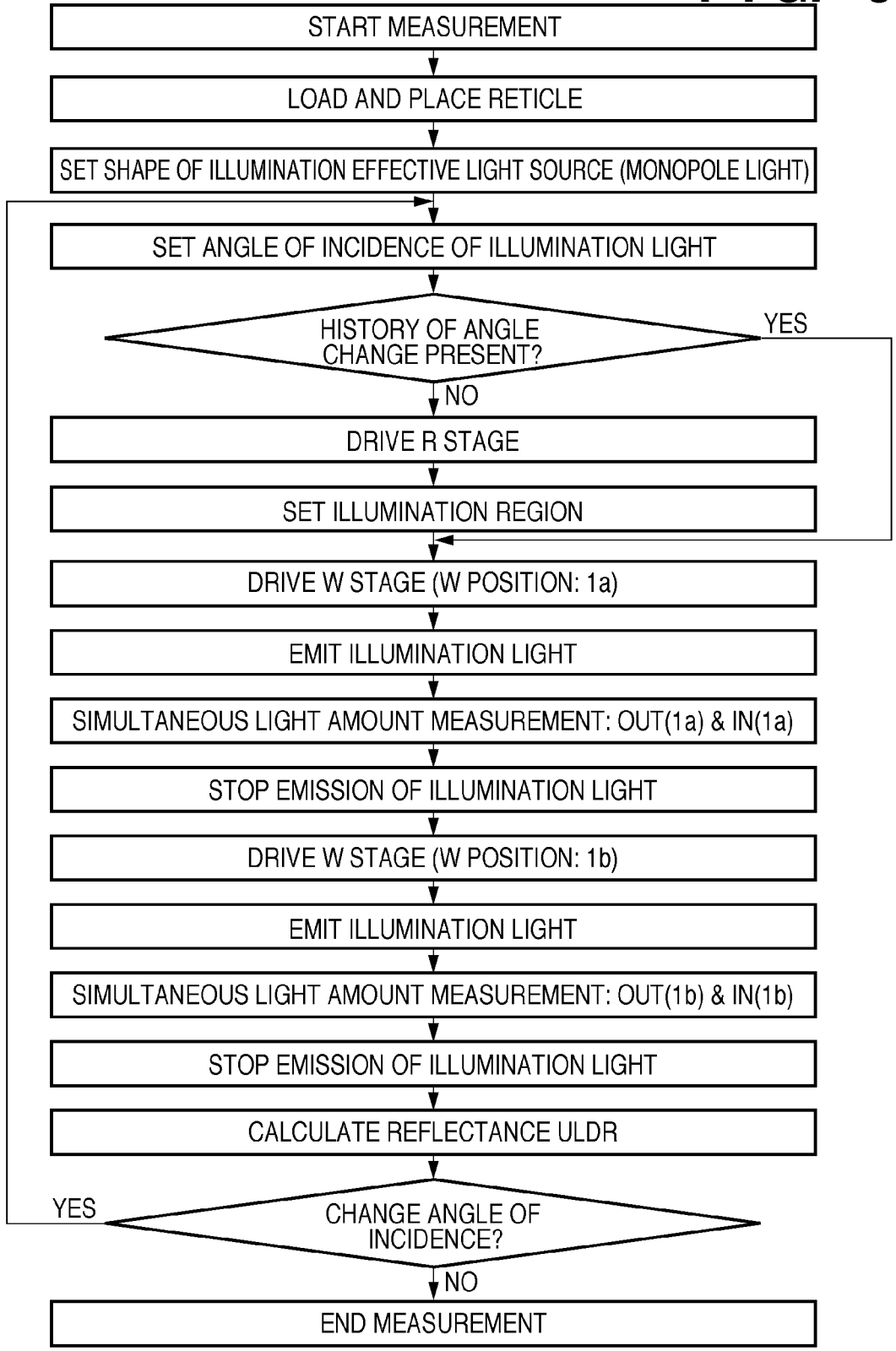
FIG. 8 is a measurement flowchart in the sixth embodiment.

FIG. 8 shows a flowchart of measurement as an example of FIG. 1C when measurement is repeated by changing the angle of incidence.

First, the angle of incidence of the illumination light is determined as $\theta 1$ as the initial preset value, and a reflectance ULDR ($\theta 1$) with respect to the angle $\theta 1$ of incidence of the illumination light is calculated. This procedure is the same as that in FIG. 1C, and its detailed description will accordingly be omitted.

A case will now be described in which the angle of incidence of the illumination light is to be changed to $\theta 2$. For the angle $\theta 2$ of incidence, R stage driving and the illumination region need not be set again but are the same as those determined for the angle $\theta 1$ of incidence. The driving position of the W stage is changed to a position $W(1a, \theta 2)$ calculated again for the angle θ2 of incidence. With the position W(1a, θ2), simultaneous light amount measurement is performed to measure OUT(1a, θ2) and IN(1a, θ2). The W stage is driven to a position W(1b, θ2) calculated again for the angle θ2 of incidence. In this state, simultaneous light amount measurement is performed to measure OUT(1b, θ2) and IN(1b, θ2). Using the measurement values OUT(1a, θ2), IN(1a, θ2), OUT(1b, θ2), and IN(1b, θ2), the reflectance ULDR (θ2) for the angle θ2 of incidence of the illumination light is calculated. Measurement for up to an angle θn of incidence of the illumination light is performed in the same manner to calculate the reflectance ULDR (θn) for the angle θn of incidence of the illumination light.

In this manner, the surface reflectances of the optical element for the angles θ1 to θn of incidence of the illumination light can be measured. The optical property values such as the refractive index and thickness of the contaminant attaching to the optical element surface can be estimated from a change in angular characteristics of the surface reflectance.

Seventh Embodiment

Figure 9:
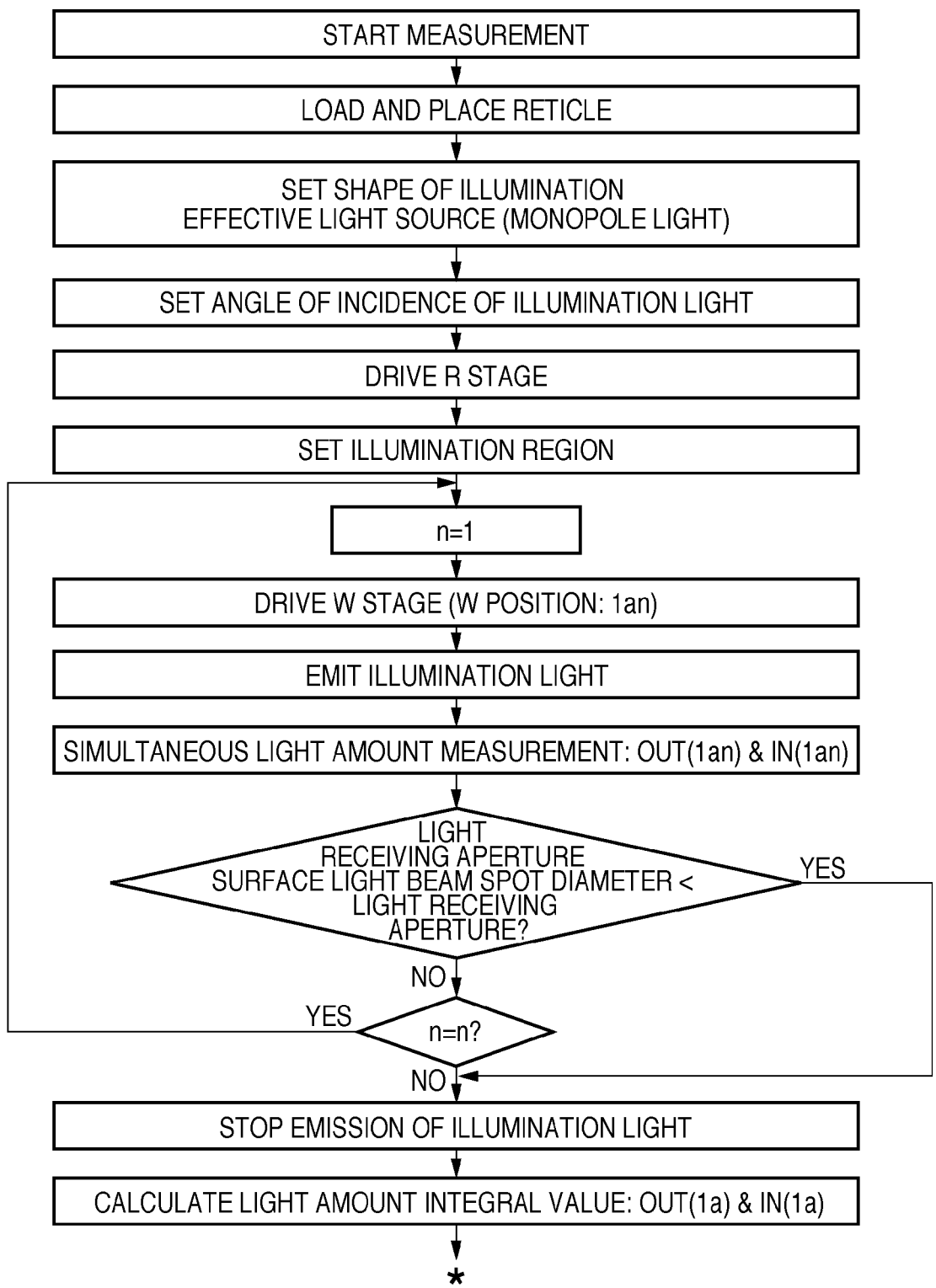
FIG. 9 is a measurement flowchart in the seventh embodiment.
Figure 10:
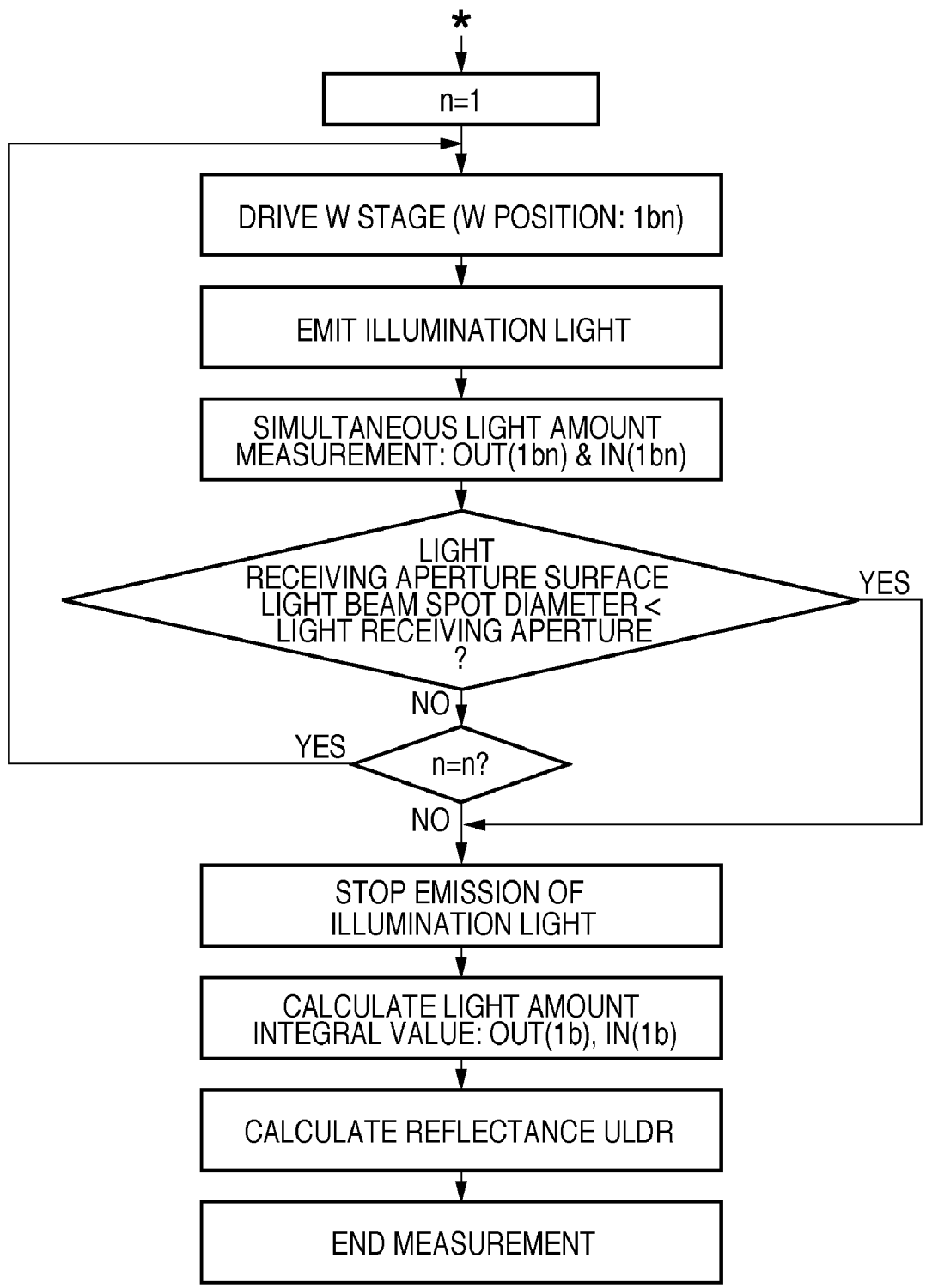
FIG. 10 is a flowchart showing continuation to the measurement flowchart in FIG. 9.

FIGS. 9 and 10 show measurement flowcharts as an example of FIG. 1C in which multi-point light amount measurement is performed using a driving stage. In FIG. 1C, the aperture diameter of the projection optical system 1 is set larger by the defocus amount of the image, and the light amount distribution of the light beam irradiating the interior of the aperture portion of the light receiving aperture 41 is uniform. The light receiving amounts OUT(1a) and OUT(1b) of the wafer side light amount sensor 4 are measured at one position where the central light beam passing through the transmissive aperture pattern 31 coincides with the aperture center of the light receiving aperture 41. In contrast to this, the measurement flowchart shown in FIG. 9 shows a case in which the aperture diameter of a transmissive aperture pattern 31 and a light receiving aperture 41 of a wafer side light amount sensor 4 are not restricted. Only points in FIGS. 9 and 10 that are different from FIG. 1C will be described hereinafter.

First, in the state in FIG. 1A, if the focused spot diameter of the measurement light beam of the wafer side light amount sensor 4 on the light receiving aperture surface is larger than the light receiving aperture 41 of the wafer side light amount sensor 4, the driving stage is moved along the grids of the light receiving surface to measure the light received amount. The driving stage is translated within the light receiving surface such that the center of the light receiving aperture 41 of the wafer side light amount sensor 4 is located at a lattice point of a lattice shown in FIG. 11A as an example for n=9.

Simultaneous light amount measurement is performed for each lattice point to measure OUT(1a1) and IN(1a1), . . . , and OUT(1an) and IN(1an), thus obtaining the light amount integrated value of OUT(1a1) to OUT(1an) and the light amount integrated value of IN(1a1) to IN(1an). The reflectance ULDR is calculated from the light amount integrated value of OUT(1a1) to OUT(1an) and the light amount integrated value of IN(1a1) to IN(1an). In the state in FIG. 1B as well, the measurement procedure which is the same as that in the state in FIG. 1A is performed.

The measurement pitch (lattice point distance) of measurement of stage movement on the lattice will be described. FIG. 11B shows a case in which the light receiving aperture 41 of the wafer side light amount sensor 4 is a circular aperture.

Figure 11A:
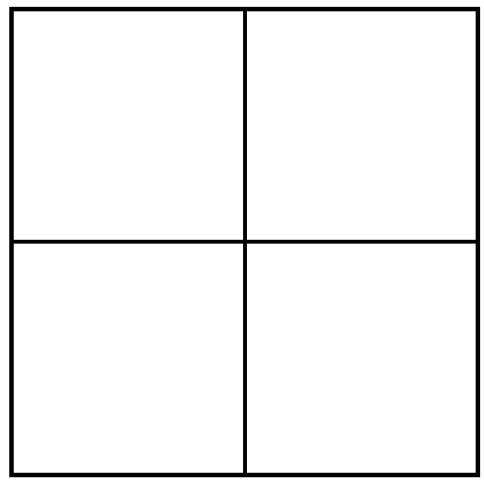
FIG. 11A is a view for explaining the relationship between a measurement point and light receiving aperture in the seventh embodiment.
Figure 11B:
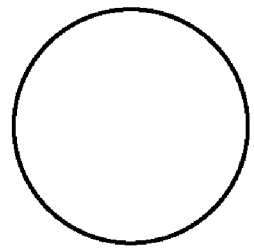
FIG. 11B is a view for explaining the relationship between a measurement point and light receiving aperture in the seventh embodiment.

Assume that the aperture diameter of FIG. 11B is indicated by R, and the lattice point distance shown in FIG. 11A, that is, the measurement pitch is indicated by D. FIG. 11C shows the arrangement of light receiving apertures obtained as the result of driving measurement, and the focused spot diameter of the measurement light beam indicated by a broken line when D=R. In FIG. 11C, gaps exist among the arranged light receiving apertures, and the light amount distributions of the measurement light beam in these gap portions cannot be measured.

In contrast to this, FIG. 11D shows the arrangement of light receiving apertures obtained as the result of driving measurement, and the focused spot diameter of the measurement light beam indicated by a broken line when D=R/2. In FIG. 11D, since no gap exists among the arranged light receiving apertures, the light amount distribution of the measurement surface can be measured in the entire region. The measurement pitch (lattice point distance) for measuring stage movement on the lattice is desirably $D \leq R/2$ when the light receiving apertures are circular and $D \leq R$ when the light receiving apertures are square where R is the length of the side of the square.

When the light receiving apertures have other shapes, the stage is moved and measured by setting a small measurement pitch (lattice point distance) so that no gap is present among the arranged light receiving apertures. Naturally, the range where the stage is to be moved and measured includes the light focused spot diameter of the measurement light beam.

Other Embodiments

In FIGS. 1C, 2D, 2E, 8, 9, and 10, the reflectance is measured using a transmissive aperture pattern formed in the reticle 3. The irradiation region may be limited, in that transmissive area of the reticle 3 where no pattern is present, by a mechanism that changes the irradiation region in the illumination system 2. Also, in FIGS. 1C, 8, 9, and 10, with no reticle being present, the irradiation region may be limited by a mechanism that changes the irradiation region in the illumination system 2. In FIGS. 2D and 2E as well, as far as an object side reflecting surface is formed independently of the reticle surface, the irradiation region may be limited by a mechanism that changes the irradiation region in the illumination system 2 with no reticle being present.

In FIGS. 1C, 2D, 2E, 8, 9, and 10, the light amounts IN(1a), IN(1b), and the like are measured by the exposure amount sensor in the illumination system. If the light source can emit light with an almost constant light amount, the light amounts IN(1a), IN(1b), and the like need not be measured. If the light source emits light with an almost constant light amount, IN(1a)≈IN(1b) is satisfied.

In FIGS. 1C, 2D, 2E, 8, 9, and 10, measurement may be performed by adjusting the light emission amount from the light source such that OUT(1a)≈OUT(1b) is satisfied. Then, in the wafer side light amount sensor 4, the adverse effect of a decrease in SN ratio of both OUT(1a) and OUT(1b) which is caused by the electric noise can be minimized. In this case, the light amounts measured by the exposure amount sensor in the illumination system satisfy IN(1a)<IN(1b).

In FIGS. 1C, 2D, 2E, 8, 9, and 10, the reflectance is measured using the wafer side light amount sensor 4 formed on the substrate stage 5. However, the wafer side light amount sensor 4 need not be fixed on the substrate stage 5. For example, a measurement unit such as a light amount sensor, a power supply, and a communication instrument may be formed on a circular plane-parallel plate having the same shape as that of the wafer. In this case, a light amount receiving aperture and reflecting surface are formed on the upper surface of the circular plane-parallel plate, and the light amount measurement result is transmitted to the exposure apparatus main body through wireless communication.

An example of a method of manufacturing a device using the exposure apparatus described above will be described.

A device (a semiconductor integrated circuit element, a liquid crystal display device, and the like) is manufactured by an exposure step of exposing a substrate using the exposure apparatus of the embodiment described above, a developing step of developing the substrate exposed in the exposure step, and other known steps (etching, resist removed, dicing, bonding, packaging, and the like) of processing the substrate developed in the developing step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-197852, filed Jul. 30, 2007 which is hereby incorporated by reference herein in its entirety.

What is claimed is:

1. An exposure apparatus which exposes a substrate with a pattern formed on a reticle, the apparatus comprising:
    a projection optical system including an optical element;
    a reflecting surface which reflects light toward said projection optical system; and
    a processor which extracts information from a first signal based on first light which is incident on said projection optical system and reflected by said reflecting surface and a surface of said optical element and information from a second signal based on second light which is incident on said projection optical system and not reflected by said reflecting surface and said surface of said optical element, and which obtains information indicating a surface condition of said optical element using information from said first signal and information from said second signal.

2. An apparatus according to claim 1, wherein said reflecting surface is positioned on at least one of an image plane or an object plane of said projection optical system.

3. An apparatus according to claim 1, further comprising:
    a sensor which is positioned on a substrate stage that supports the substrate and detects the first light and the second light,
    wherein said processor obtains a signal based on light detected by said sensor.

4. An apparatus according to claim 3, wherein:
    said projection optical system includes a plurality of optical elements, and
    said processor obtains information indicating a surface condition of a specific one of said plurality of optical elements by changing a position of said sensor with respect to said projection optical system.

5. An apparatus according to claim 1, wherein the information indicating the surface condition of said optical element comprises a surface reflectance.

6. An apparatus according to claim 1, wherein a substrate side and a reticle side of said projection optical system are telecentric, and a lower surface of an optical element closest to the substrate and an upper surface of an optical element closest to the reticle side, which constitute said projection optical system, form planes.

7. An apparatus according to claim 1, wherein said processor obtains the information indicating the surface condition of said optical element for each one of angles of incidence obtained by changing an angle of incidence of light on said projection optical system.

8. An apparatus according to claim 1, further comprising:
    an illumination optical system which illuminates the reticle with light from a light source,
    wherein said illumination optical system includes a shaping member which shapes the light from said light source to be obliquely incident on an object plane of said projection optical system.

9. An apparatus according to claim 8, wherein said shaping member shapes the light from said light source to form a monopole-shaped effective light source on a pupil plane of said projection optical system.

10. A method of manufacturing a device, the method comprising:
    exposing a substrate using an exposure apparatus according to claim 1;
    developing the exposed substrate; and
    processing the developed the substrate to manufacture the device.

* * * * *